United States Patent
Toyao et al.

(10) Patent No.: US 8,890,761 B2
(45) Date of Patent: Nov. 18, 2014

(54) STRUCTURE, PRINTED CIRCUIT BOARD, ANTENNA, TRANSMISSION LINE TO WAVEGUIDE CONVERTER, ARRAY ANTENNA, AND ELECTRONIC DEVICE

(75) Inventors: Hiroshi Toyao, Tokyo (JP); Noriaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 697 days.

(21) Appl. No.: 13/057,032

(22) PCT Filed: Jul. 31, 2009

(86) PCT No.: PCT/JP2009/003665
§ 371 (c)(1),
(2), (4) Date: Feb. 1, 2011

(87) PCT Pub. No.: WO2010/013496
PCT Pub. Date: Feb. 4, 2010

(65) Prior Publication Data
US 2011/0134010 A1    Jun. 9, 2011

(30) Foreign Application Priority Data

Aug. 1, 2008  (JP) ................................ 2008-199624
Apr. 30, 2009  (JP) ................................ 2009-111439

(51) Int. Cl.
| | |
|---|---|
| H01Q 19/00 | (2006.01) |
| H01Q 21/08 | (2006.01) |
| H01Q 9/42 | (2006.01) |
| H01P 5/02 | (2006.01) |
| H01P 1/20 | (2006.01) |
| H05K 1/02 | (2006.01) |
| H01Q 9/04 | (2006.01) |
| H05K 1/16 | (2006.01) |

(52) U.S. Cl.
CPC ................. *H01Q 9/42* (2013.01); *H01Q 21/08* (2013.01); *H01P 5/028* (2013.01); *H05K 1/165* (2013.01); *H01P 1/2005* (2013.01); *H05K 1/0236* (2013.01); *H05K 2201/09309* (2013.01); *H01Q 9/0407* (2013.01)

USPC ...... 343/833; 343/834; 343/844; 343/700 MS

(58) Field of Classification Search
CPC .......... H01Q 19/10; H01Q 19/32; H01Q 3/44
USPC ........................... 343/700 MS, 833, 834, 844
See application file for complete search history.

(56) References Cited

U.S. PATENT DOCUMENTS

| | | |
|---|---|---|
| 4,835,540 A | 5/1989 | Haruyama |
| 5,598,168 A | 1/1997 | Evans |

(Continued)

FOREIGN PATENT DOCUMENTS

| | | |
|---|---|---|
| JP | 2002-510886 | 4/2002 |
| JP | 2003-304113 A | 10/2003 |

(Continued)

OTHER PUBLICATIONS

Noriaki Ando et al. —A Study Electromagnetic Bandgap (EBG) Structures for Suppression of Power Noise in Electronic Equipment—Novel Inductance-Enhanced EBG Structures—IEICE Technical Report EMCJ2007-110 vol. 107 No. 456, pp. 25-30.

(Continued)

*Primary Examiner* — Dameon E Levi
*Assistant Examiner* — Collin Dawkins
(74) *Attorney, Agent, or Firm* — Young & Thompson

(57) ABSTRACT

A structure includes a first conductor plane; a plurality of second conductor planes, at least a portion thereof being provided facing the first conductor plane; a transmission line that is provided with at least a portion thereof facing one conductor plane of the first conductor plane and the second conductor plane, and that is disposed on an opposite side of the other conductor plane with respect to the one conductor plane; and a first conductor connecting portion that electrically connects the transmission line with the other conductor plane, and a unit structure that includes at least the second conductor plane, the transmission line, and the first conductor connecting portion is repeatedly disposed.

26 Claims, 28 Drawing Sheets

(56) References Cited

U.S. PATENT DOCUMENTS

| | | |
|---|---|---|
| 2004/0160367 A1* | 8/2004 | Mendolia et al. ...... 343/700 MS |
| 2005/0019051 A1 | 1/2005 | Nozawa |
| 2005/0029632 A1 | 2/2005 | McKinzie, III |
| 2005/0195051 A1 | 9/2005 | McKinzie, III |
| 2005/0205292 A1 | 9/2005 | Rogers |
| 2006/0044210 A1 | 3/2006 | Ramprasad |
| 2006/0044211 A1 | 3/2006 | Ramprasad |
| 2006/0186970 A1 | 8/2006 | Shi |
| 2007/0090901 A1 | 4/2007 | Kanno |
| 2007/0176827 A1 | 8/2007 | Itoh |
| 2007/0257853 A1 | 11/2007 | Gevorgian |
| 2007/0285188 A1 | 12/2007 | Song |
| 2007/0285336 A1 | 12/2007 | Kamgaing |
| 2008/0048917 A1* | 2/2008 | Achour et al. ......... 343/700 MS |
| 2008/0143607 A1* | 6/2008 | Jung et al. .............. 343/700 MS |
| 2008/0264685 A1 | 10/2008 | Park |
| 2009/0015354 A1 | 1/2009 | Kim |
| 2010/0053013 A1 | 3/2010 | Konishi |
| 2010/0108373 A1 | 5/2010 | Park |

FOREIGN PATENT DOCUMENTS

| | | |
|---|---|---|
| JP | 2004-140210 A | 5/2004 |
| JP | 2006-253929 | 9/2006 |
| JP | 2008-42233 | 2/2008 |
| JP | 2008-236027 A | 10/2008 |
| WO | 2007/127955 | 11/2007 |
| WO | 2009/082003 | 7/2009 |

OTHER PUBLICATIONS

International Search Report—PCT/JP2009/003665—Oct. 27, 2009.

Noriaki Ando et al. —A Study on Electromagnetic Bandgap (EBG) Structures for Suppression of Power Noise in Electronic Equipment—Novel Inductance-Enhanced EBG Structures—IEICE Technical Report EMCJ2007-110 vol. 107 No. 456, pp. 25-30.

Li Yang, et al., "A Spiral Electromagnetic Bandgap (EBG) Structure and its Application in Microstrip Antenna Arrays", Microwave Conference Proceedings, 2005; APMC 2005, Asia-Pacific Conference Proceedings, Suzhou, China Dec. 4-7, 2005, Piscataway, N.J., USA, IEEE, vol. 3, Dec. 4, 2005, pp. 1-4, XP010902238, ISBN: 978-0-7803-9433-9.

Liu et al., Enhanced Bandwidth Uniplanar Compact Electromagnetic Bandgap Structure with Coplanar Meander Line Inductance, Electronics Letters, Feb. 14, 2008, vol. 44, No. 4, pp. 260-261.

* cited by examiner

STRUCTURE, PRINTED CIRCUIT BOARD, ANTENNA, TRANSMISSION LINE TO WAVEGUIDE CONVERTER, ARRAY ANTENNA, AND ELECTRONIC DEVICE

TECHNICAL FIELD

The present invention relates to a structure, a printed circuit board, an antenna, a transmission line to waveguide converter, an array antenna, and an electronic device. In particular, it relates to a structure that is constituted to include a composite right and left handed medium and in which the dispersion relation with respect to electromagnetic waves is controlled, and a printed circuit board, an antenna, a transmission line to waveguide converter, an array antenna, and an electronic device that include this structure.

BACKGROUND ART

In order to artificially control the dispersion relation of electromagnetic waves, there is known a structure in which a material, a conductor patch or the like having different dielectric constants is periodically arrayed. In this kind of structure, a structure that possesses a dispersion relation having a bandgap in which propagation of electromagnetic waves is prohibited in a specified frequency band is called an electromagnetic bandgap (hereinbelow, EBG) structure.

When such an EBG structure is installed on a printed circuit board or a device package substrate, it will inhibit the propagation of surface waves that are produced on the substrate surface. For this reason, the EBG structure is employed in order to reduce the electromagnetic interference between the antennas or devices mounted on the printed circuit board.

This EBG structure functions as a magnetic wall that reflects incident electromagnetic waves in phase in the vicinity of the band gap frequency band. For this reason, by installing the EBG structure on the back surface of an antenna, it is possible to achieve a lower profile of the antenna while maintaining its radiation efficiency.

Generally, an EBG structure has a structure in which square conductor patches are periodically arranged in a two-dimensional manner on the surface of a dielectric layer such as a printed circuit board, and each patch and a conductor plane on the rear face of the dielectric layer are electrically connected by through-hole vias or the like. In an EBG structure, because the capacitance component formed between the patches and the inductance component formed from the vias function as an LC parallel resonant circuit, a band gap arises near the resonance frequency.

In order to make the band gap region of the EBG structure correspond to the low frequency band region, the inductance component should be increased. A common method of increasing the inductance component is to adopt a method that lengthens the through-hole vias. For this reason, as a result of making it correspond to the low frequency band, there has been the problem of the thickness of the EBG structure increasing.

Patent Document 1 given below discloses an EBG structure that solves this kind of problem. The EBG structure that is shown in FIG. 12 in Patent Document 1 has, between the patch layer and the conductor plane layer, an intermediate layer in which is disposed an inductance element such as a spiral inductor, and this patch, the inductance element, and the conductor plane are connected by vias. With such a structure, the band gap region is made to correspond to the low frequency band by increasing the inductance component without enlarging the EBG structure.

PRIOR ART DOCUMENT

Patent Document

[Patent Document 1] Japanese Unexamined Patent Application, First Publication No. 2006-253929

SUMMARY OF THE INVENTION

Problem to be Solved by the Invention

However, in the conventional art, as the space between the patch layer and the conductor plane layer decreases, the coupling between the inductance element, the patch layer and the conductor plane strengthens, whereby the frequency characteristic of the inductance element is changed. For this reason, there is the problem of prediction of the band gap frequency band becoming difficult.

The exemplary embodiments of the present invention have been achieved in view of these circumstances, and an object thereof is to provide a structure that is comparatively thin and in which a band gap frequency band can be readily designed, as well as a printed circuit board, an antenna, a transmission line to waveguide converter, an array antenna, and an electronic device including this structure.

Means for Solving the Problem

In order to achieve the aforementioned object, the present invention adopts the following means.

A structure of the present invention includes a first conductor plane, a plurality of second conductor planes, at least a portion thereof being provided facing the first conductor plane, a transmission line that is provided with at least a portion thereof facing one conductor plane of the first conductor plane and the second conductor plane, and that is disposed on an opposite side of the other conductor plane with respect to the one conductor plane, and a first conductor connecting portion that electrically connects the transmission line with the other conductor plane, and a plurality of unit structures each including at least the second conductor plane, the transmission line, and the first conductor connecting portion are repeatedly disposed.

In the structure according to the present invention, a short stub or open stub is constituted including the transmission line. The short stub or open stub can realize an LC parallel resonant state in a specified frequency band by an impedance conversion effect that depends on the stub length. Therefore, it is possible to adjust the dispersion relation of the structure by adjusting the stub length.

Here, in the structure according to the present invention, since the transmission line is arranged at the outermost layer, it can be handled as a microstrip line that uses the one conductor plane as a return path. Since the relation between the propagation constant in this microstrip line and the physical dimensions of the line is formulated in various forms, it is possible to readily and accurately calculate the impedance conversion.

Accordingly, compared to a structure in which an inductance element is provided between the patch layer and the conductor plane layer, it is possible to accurately and readily design the dispersion relation of the structure, and for example it is possible to set the band gap band in the desired frequency band.

The structure according to the exemplary aspect of the present invention may representatively have the following constitutions.

There may be a constitution in which the unit structures are periodically arrayed one-dimensionally or two-dimensionally.

There may be a constitution in which the first conductor plane is in common at the plurality of unit structures that are repeatedly disposed.

There may be a constitution in which each of the unit structures has a band gap in a dispersion relation of frequency with respect to a wave number or a wavelength of an electromagnetic wave that is incident upon the unit structure, and an electromagnetic band gap structure is constituted by including each of the unit structures.

There may be a constitution in which a dielectric layer is provided between the first conductor plane and the second conductor plane, and the first conductor connecting portion is a conductor via that is provided passing through the dielectric layer.

There may be a constitution in which an opening is provided in the one conductor plane, and the conductor via intersects with the one conductor plane by passing through the opening, and makes no contact with the one conductor plane.

There may be a constitution in which the one conductor plane is a return path of the transmission line.

There may be a constitution in which a dimension of the one conductor plane in a surface direction of a surface that faces the second conductor plane differs from a dimension of the second conductor plane in a surface direction of a surface that faces the first conductor plane.

There may be a constitution in which a surface of the second conductor plane that faces the first conductor plane is parallel with a surface of the first conductor plane that faces the second conductor plane.

There may be a constitution in which the transmission line includes a plurality of end portions, and at least one of the plurality of end portions is electrically connected with the first conductor connecting portion.

There may be a constitution in which the transmission line includes a branching portion and branch lines that are mutually branched from the branching portion, and the line lengths of the branch lines mutually differ.

There may be a constitution in which the transmission line is planarly provided on a surface facing the one conductor plane, and the planar shape of the transmission line is a spiral shape.

There may be a constitution in which the transmission line is planarly provided on a surface facing the one conductor plane, and planar shape of the transmission line is a meander shape.

There may be a constitution in which the transmission line is covered by a dielectric portion.

There may be a constitution in which a second conductor connecting portion that electrically connects the one conductor plane and the transmission line is included, and a portion at which the transmission line is electrically connected to the second conductor connecting portion and a portion at which the transmission line is electrically connected to the first conductor connecting portion are arranged at different positions in the extending direction of the transmission line.

There may be a constitution in which the transmission line is electrically insulated with respect to the one conductor plane.

A printed circuit board of the present invention includes a structure of the present invention.

The printed circuit board according to the exemplary aspect of the present invention may representatively have the following constitutions.

There may be a constitution in which a reflecting plate is constituted by the structure.

There may be a constitution in which a plurality of devices are provided on the printed circuit board, and the structure is provided blocking at least one of propagation paths of electromagnetic waves between the devices.

There may be a constitution in which a feed portion is provided that supplies an electrical signal to at least one of unit structures that constitute the structure.

An antenna of the present invention includes the structure of the present invention.

The antenna according to the exemplary aspect of the present invention may representatively have the following constitutions.

There may be a constitution in which a reflecting plate is constituted by the structure.

There may be a constitution in which a feed portion is provided that supplies an electrical signal to at least one of the unit structures that constitute the structure.

There may be a constitution in which there is included at least one auxiliary conductor plane that is provided on a different plane than the second conductor planes and that is arranged so as to overlap with two of the second conductor planes that are mutually adjacent.

There may be a constitution in which the auxiliary conductor plane is arranged on a same plane as the transmission line.

There may be a constitution in which the feed portion is provided on a same plane as the second conductor planes, and is electrically connected to at least one of the second conductor planes.

There may be a constitution in which the feed portion includes a coplanar line that is provided on a same plane as the first conductor plane and is electrically connected to any one of the conductor vias.

A transmission line to waveguide converter of the present invention includes the structure of the present invention.

An array antenna of the present invention includes the antenna of the present invention.

An electronic device of the present invention includes at least one of the structure according to the present invention, the printed circuit board according to the present invention, the antenna according to the present invention, the transmission line to waveguide converter according to the present invention, and the array antenna according to the present invention.

Effect of the Invention

According to the present invention, it is possible to accurately and readily design a dispersion relation of a structure, and it is possible to lower the frequency of the band gap band without making the structure thicker.

EMBODIMENTS FOR CARRYING OUT THE INVENTION

Hereinbelow, exemplary embodiments of the present invention shall be described with reference to the drawings. The structures of the exemplary embodiments of the present invention include a composite right and left handed medium (CRLH transmission line) that is a metamaterial. In the exemplary embodiments of the present invention, the dispersion relation of a CRLH transmission line is controlled with high precision, and the structures of the exemplary embodiments of the present invention are capable of being operated as a right-handed medium, EBG structure, or a left-handed medium. The first to eighth exemplary embodiments hereinbelow relate to a structure that operates chiefly as an EBG structure. The ninth to fifteenth exemplary embodiments hereinbelow relate to a structure that operates chiefly as a left-handed medium.

Figure 1:
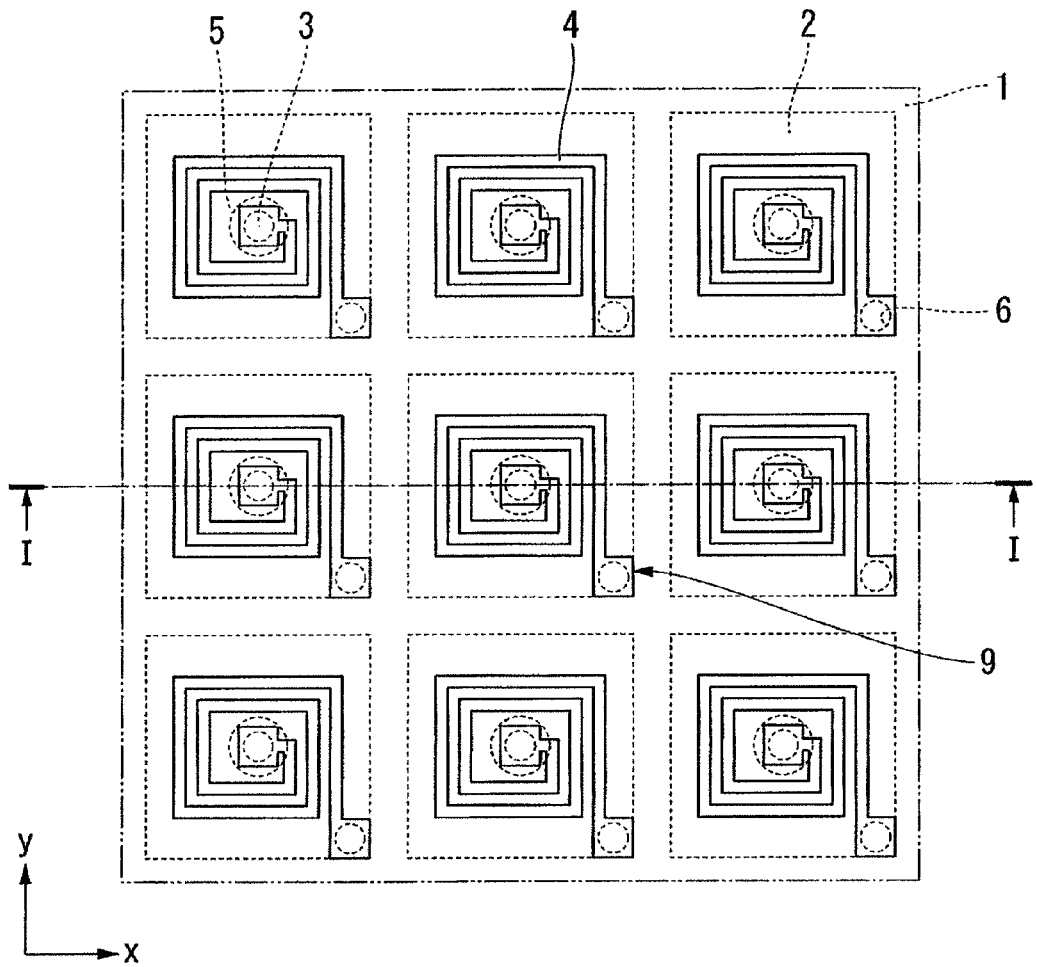
FIG. 1 is a plan view of an EBG structure according to a first exemplary embodiment of the present invention.
Figure 2:
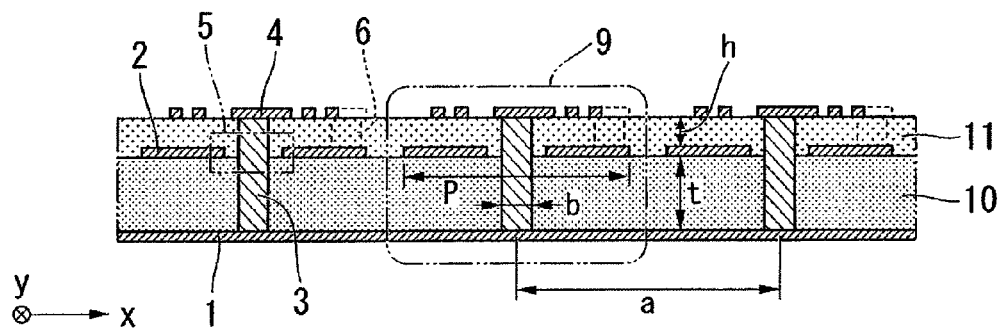
FIG. 2 is a cross-sectional view of the EBG structure according to the first exemplary embodiment of the present invention, being a cross-sectional view along line I-I in FIG. 1.

FIG. 1 is a plan view of an EBG structure according to the first exemplary embodiment of the present invention. FIG. 2 is a cross-sectional view along line I-I in FIG. 1. As shown in FIG. 2, the EBG structure according to the first exemplary embodiment of the present invention has a first dielectric layer 10, a conductor plane 1 serving as a first conductor plane, conductor patches 2 serving as a plurality of second conductor planes, a second dielectric layer 11, a transmission line 4, a conductor via 3 serving as a first conductor connecting portion, and a short-circuit via 6 serving as a second conductor connecting portion. The conductor plane 1 is arranged on the bottom surface of the first dielectric layer 10. The conductor patches 2 have a square shape and are arranged on the upper surface of the first dielectric layer 10. The second dielectric layer 11 is arranged on the upper portion of the conductor patches 2. The transmission line 4 has spiral shape, is arranged on the upper portion of the second dielectric layer 11 corresponding to each conductor patch 2, and uses the conductor patch 2 as a return path. The conductor via 3 connects one end of the transmission line 4 that is positioned on the center side and the conductor plane 1. The short-circuit via 6 connects the other end of the transmission line 4 on the outward side and the conductor patch 2.

The EBG structure of the first exemplary embodiment has a constitution in which one conductor plane of the first conductor plane (conductor plane 1) and the second conductor plane (conductor patch 2) is the conductor patch 2, and the other conductor plane is the conductor plane 1. That is, the transmission line 4 is arranged on the opposite side of the other conductor plane (conductor plane 1) with respect to the one conductor plane (conductor patch 2).

In FIG. 1, for convenience of description, the conductor plane 1 and the conductor patch 2 are illustrated with the first dielectric layer 10 and the second dielectric layer 11 made transparent. Although the short-circuit via 6 is not precisely shown in FIG. 2 at the cross-sectional plane I-I of FIG. 1, for convenience of description the short-circuit via 6 is indicated by a dotted line in FIG. 2.

The first dielectric layer 10 and the second dielectric layer 11 have thin plate shapes, of which the upper surface and lower surface are parallel. That is, the conductor plane 1 and the conductor patch 2 are arranged to be mutually parallel via the first dielectric layer 10.

The conductor via 3 is provided from the bottom surface of the first dielectric layer 10 to the upper surface of the second dielectric layer 11, and extends in a direction that is perpendicular to these two surfaces. The conductor via 3 connects the conductor plane 1 and the transmission line 4. This conductor via 3 has no contact with the conductor patch 2. Specifically, an opening is formed in the conductor patch 2 at a position corresponding to the conductor via 3, and a clearance 5 is provided. The opening in the conductor patch 2 is a larger diameter than the outer diameter of the conductor via 3, and so there is no electrical connection between the conductor patch 2 and the conductor via 3.

The one end of the transmission line 4 that is located on the center side is connected with the conductor plane 1 by the conductor via 3, and the other end on the outward side is connected to the conductor patch 2 by the short-circuit via 6. This transmission line 4, viewed from the conductor via 3 side, is constituted so that it may function as a short stub that is short-circuited by the short-circuit via 6.

The short-circuit via 6 is provided from the upper surface to the lower surface of the second dielectric layer 11, and extends in the direction that is perpendicular to these two surfaces. The short-circuit via 6 connects the conductor patch 2 and the other end of the transmission line 4 on the outward side.

The EBG structure according to the exemplary embodiment of the present invention has a structure in which the unit structures 9 having the conductor patch 2 that is provided with the clearance 5, the transmission line 4, and the short-circuit via 6 and conductor via 3 are periodically arranged, as shown in FIGS. 1 and 2. The clearance 5 is provided in the conductor patch 2. The transmission line 4 is arranged corresponding to the conductor patch 2. The short-circuit via 6 and the conductor via 3 are connected to both ends of the transmission line 4. At least one unit structure 9 is periodically arranged at a lattice point on the xy plane that is defined by independent vectors A=(A1, A2) and B=(B1, B2).

In the first exemplary embodiment, the case of a tetragonal lattice of A=(a, 0) and B=(0, a) shown in FIG. 1 is described as an example of the most fundamental lattice point.

Next, the fundamental principle of operation of the EBG structure in the present exemplary embodiment shall be described.

Figure 3:
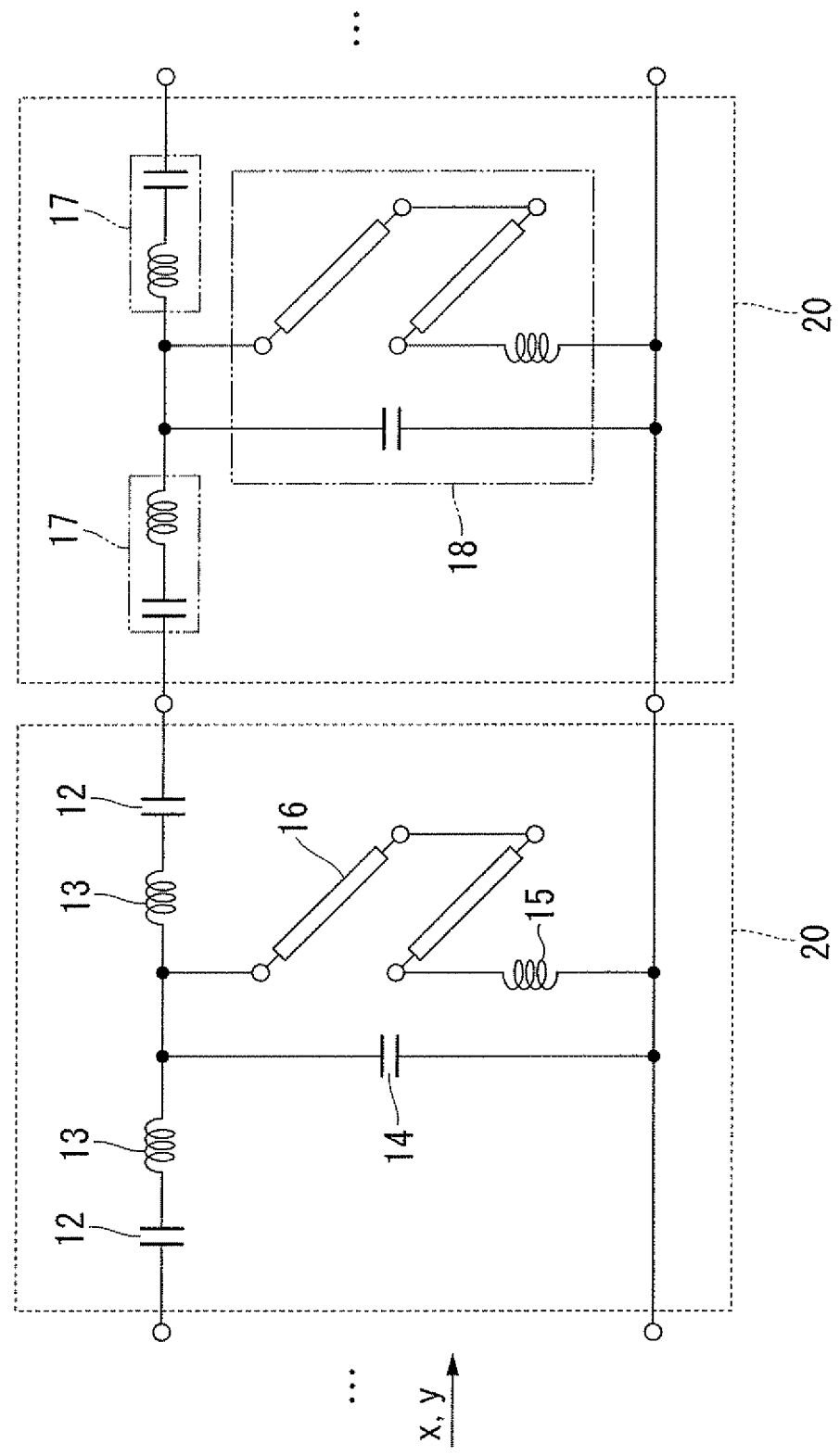
FIG. 3 is an electrical explanatory diagram of the EBG structure according to the first exemplary embodiment of the present invention, being an equivalent circuit schematic of an EBG structure.
Figure 4:
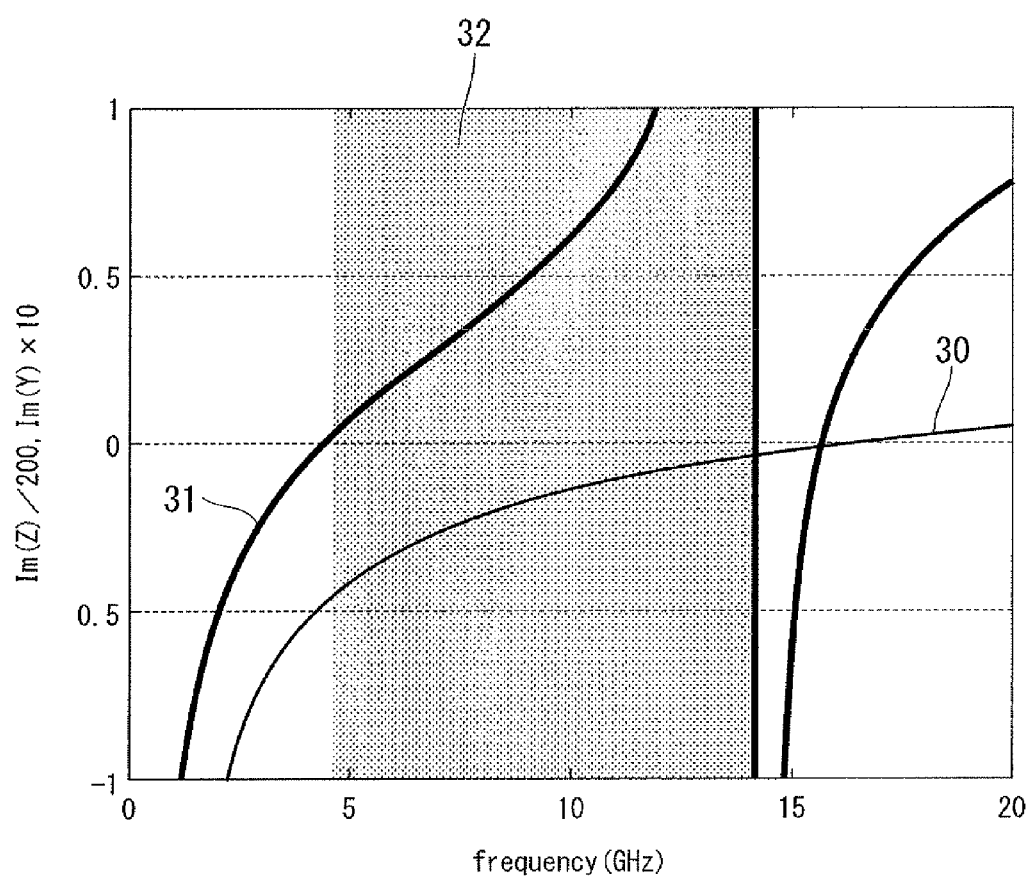
FIG. 4 is a plot diagram for describing the EBG structure according to the first exemplary embodiment of the present invention.
Figure 5:
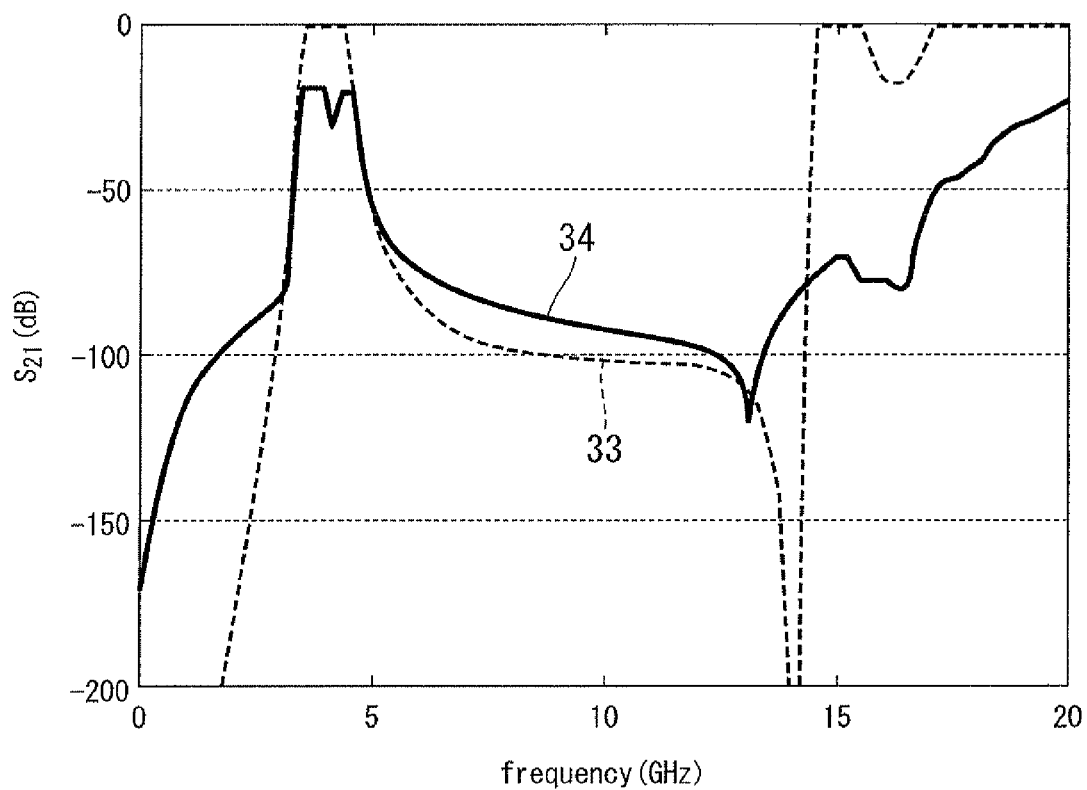
FIG. 5 is a view that shows a calculation result for describing the EBG structure according to the first exemplary embodiment of the present invention.

FIG. 3 is an equivalent circuit for electromagnetic waves that propagate in a direction along the x axis or y axis in FIG. 1. FIG. 4 is a plot of the imaginary part of the impedance Z of the impedance portion, and the imaginary part of the admittance Y of the admittance portion. FIG. 5 is the calculation result of the insertion loss of electromagnetic waves that propagate through the EBG structure in the present exemplary embodiment.

As shown in FIG. 3, the equivalent circuit repeat unit 20 in the present exemplary embodiment is constituted by an impedance portion 17 and an admittance portion 18.

The impedance portion 17 is constituted by capacitance 12 created between adjacent conductor patches 2, and inductance 13 which the conductor patch 2 creates.

The admittance portion 18 is constituted by capacitance 14 that the conductor plane 1 and the conductor patch 2 create, inductance 15 that the conductor via 3 creates, and the short stub 16 that the transmission line 4 and the short-circuit via 6 create.

At least one or more of the equivalent circuit repeat unit 20 is periodically connected, whereby the equivalent circuit of the EBG structure in the present exemplary embodiment is formed.

In the EBG structure in the exemplary embodiment of the present invention, an electromagnetic band gap is generated in a frequency region in which the imaginary part of the impedance Z of the impedance portion 17 and the imaginary part of the admittance Y of the admittance portion 18 have opposite signs to each other.

The impedance Z of the impedance portion 17 and the admittance Y of the admittance portion 18 are given by Equation (1) and Equation (2), respectively.

[Equation 1]

$$Z = i\omega \frac{L_R}{2} - i\frac{1}{2\omega C_L} \quad (1)$$

[Equation 2]

$$Y = \frac{Z_{in} + i\omega L_{via}}{Z_{in}^2 + \omega^2 L_{via}^2} + i\omega C_R \quad (2)$$

Here, $\omega$ is angular frequency, $C_L$ is the capacitance that occurs between adjacent conductor patches 2, $L_R$ is the inductance that one conductor patch 2 creates, $C_R$ is the capacitance that occurs between the conductor patch 2 and the conductor plane 1, and $L_{via}$ is the inductance that the conductor via 3 creates. $Z_{in}$ in Equation (2) is the input impedance of the short stub 16 seen from the conductor via 3 side, and is expressed by the following Equation (3).

[Equation 3]

$$Z_{in} = iZ_0 \tan(\beta d)$$

$$\beta = \omega \sqrt{\epsilon_{eff} \epsilon_0 \mu_0} \quad (3)$$

$Z_0$ in Equation (3) is the characteristic impedance of the transmission line 4, and d is the stub length (transmission line length) of the transmission line 4. $\epsilon_0$, $\mu_0$ express the permittivity and permeability, respectively, of a vacuum, and $\epsilon_{eff}$ expresses the effective relative permittivity of the transmission line 4. The structure of the transmission line 4 can be considered as a microstrip line, and the characteristic impedance and effective permittivity thereof are formulated in various forms. For example, in relation to the impedance equation, it is possible to use an equation such as Equation (4) and Equation (5). Equation (5) is a compensation equation of the wire width. In relation to the effective permittivity, for example it is possible to use an approximate equation such as Equation (6).

[Equation 4]

$$Z_0 = 30\ln\left[1 + \frac{4h}{w'}\left\{\frac{8h}{w'} + \sqrt{\left(\frac{8h}{w'}\right)^2 + \pi^2}\right\}\right] \quad (4)$$

[Equation 5]

$$w' = w + \frac{t}{\pi}\ln\frac{4e}{\sqrt{\left(\frac{t}{h}\right)^2 + \frac{1}{\pi^2\left(\frac{w}{t} + 1.1\right)^2}}} \quad (5)$$

[Equation 6]

$$\varepsilon_{eff} = \frac{\varepsilon_{sub}+1}{2} + \frac{\varepsilon_{sub}-1}{2}\left(1+10\frac{h}{w}\right)^{-0.5} - \frac{\varepsilon_{sub}-1}{4.6}\left(\frac{t/h}{\sqrt{w/h}}\right) \quad (6)$$

Here, $\varepsilon_{sub}$ is the relative permittivity of the second dielectric layer 11, h is the thickness of the second dielectric layer 11, w is the wire thickness of the transmission line 4, and t is the conductor thickness of the transmission line 4. In the EBG structure of the exemplary embodiment of the present invention, since these well-known equations can be used, it becomes possible to accurately and readily design the admittance Y.

The solid line 30 and the solid line 31 of FIG. 4 show the frequency dependency of the imaginary part Im (Z) of the impedance Z and the imaginary part Im (Y) of the admittance Y calculated from Equation (1) and Equation (2). The parameters used in the calculation are $C_L$=0.17 pF, $C_R$=0.78 pF, $L_{via}$=0.19 nH, $L_R$=0.50 nH, d=0.7 mm, $\varepsilon_{sub}$=4.188, h=60 μm, w=150 μm, and t=15 μm. Viewing FIG. 4, at the frequency band 32, since the Im (Z) and Im (Y) have opposite signs, a band gap is expected to arise in the vicinity of this frequency band. In actuality, by imposing a periodic boundary condition on the equivalent circuit repeat unit 20 of FIG. 3, it is necessary to calculate the band gap band in consideration of the periodicity of the structure.

FIG. 5 is the result of calculating the insertion loss (S21) of the electromagnetic wave that propagates by distance 7×a through the EBG structure of the first exemplary embodiment when the lattice spacing is a=3 mm. The dotted line 33 expresses the calculated result by imposing the periodic boundary condition on the equivalent circuit repeat unit 20 that uses the same parameters as the calculation of FIG. 4. The solid line 34 expresses the result of the numerical computation by three-dimensional electromagnetic field analysis. The structural dimensions of the electromagnetic field analysis model are determined so as that the circuit parameters become nearly the same as the values used in FIG. 4. The specific dimensions are, lattice spacing a=3 mm, thickness t of the first dielectric layer 10=400 μm, thickness h of the second dielectric layer 11=60 μm, length p of one side of the square conductor patch 2=2.9 mm, diameter b of the conductor via=300 μm, and transmission line length d=0.7 mm.

Looking at the electromagnetic field analysis result 34 of FIG. 5, in the end portion on the low region side of a band gap there is a good agreement between the electromagnetic field analysis result and the equivalent circuit calculation. On the other hand, in the electromagnetic field analysis result 34 of FIG. 5, the end portion on the high region side of the band gap is ambiguous, and does not show a sharp end portion such as the equivalent circuit calculation result 33. It is considered that this is because the electromagnetic waves that the structure radiates into space at higher regions than the band gap region can no longer be ignored, and the original band gap end portion is approximate to the equivalent circuit calculation.

The band gap frequency band in the insertion loss calculation result of FIG. 5 mostly agrees with the frequency range 32 shown in FIG. 4. This indicates that the band gap frequency band of the EBG structure of the exemplary embodiment of the present invention can roughly be explained with the frequency characteristic of the imaginary part Im (Z) of the impedance Z and the imaginary part Im (Y) of admittance Y. Since the EBG structure of the exemplary embodiment of the present invention can accurately find the admittance Y, it is possible to accurately and readily design a band gap frequency band. Moreover, by lengthening the transmission line length d it is possible to lower the frequency of the band gap region. For this reason, it is not necessary to make the structure thick in order to secure the inductance of the via portion as in a conventional structure, and so it can be made thinner.

If one end of the transmission line 4 is connected to the conductor via 3, and the other end is connected to the short-circuit via 6, the essential effect of the exemplary embodiment of the present invention will not be affected under any arrangement and shape.

Figure 6A:
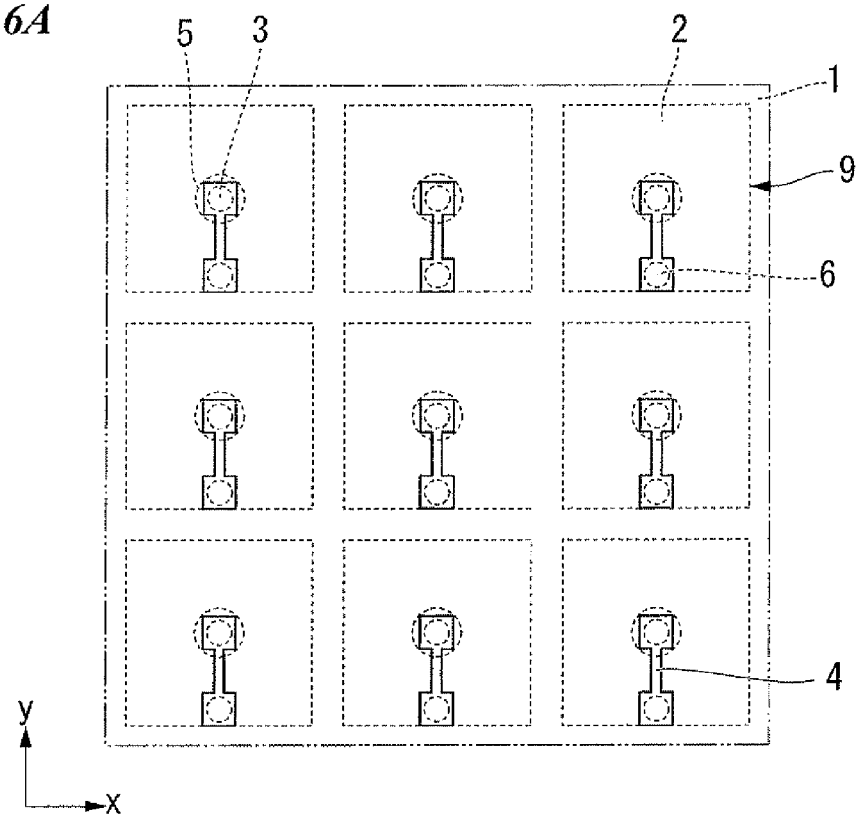
FIG. 6A is a plan view of a modification of the EBG structure according to the first exemplary embodiment of the present invention.
Figure 6B:
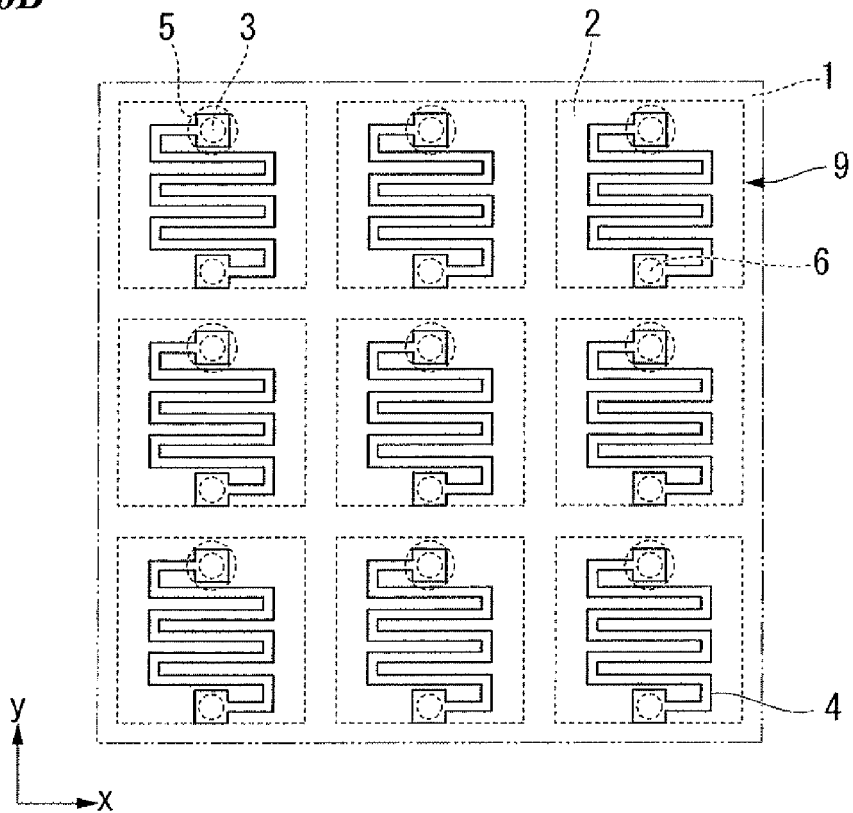
FIG. 6B is a plan view of a modification of the EBG structure according to the first exemplary embodiment of the present invention.

FIG. 1 shows the case where the transmission line 4 is made into spiral shape in order to secure the transmission line length d in a small mounting area. However, the transmission line 4 may have a linear shape as shown for example in FIG. 6A, or a meander shape as shown in FIG. 6B.

Figure 7:
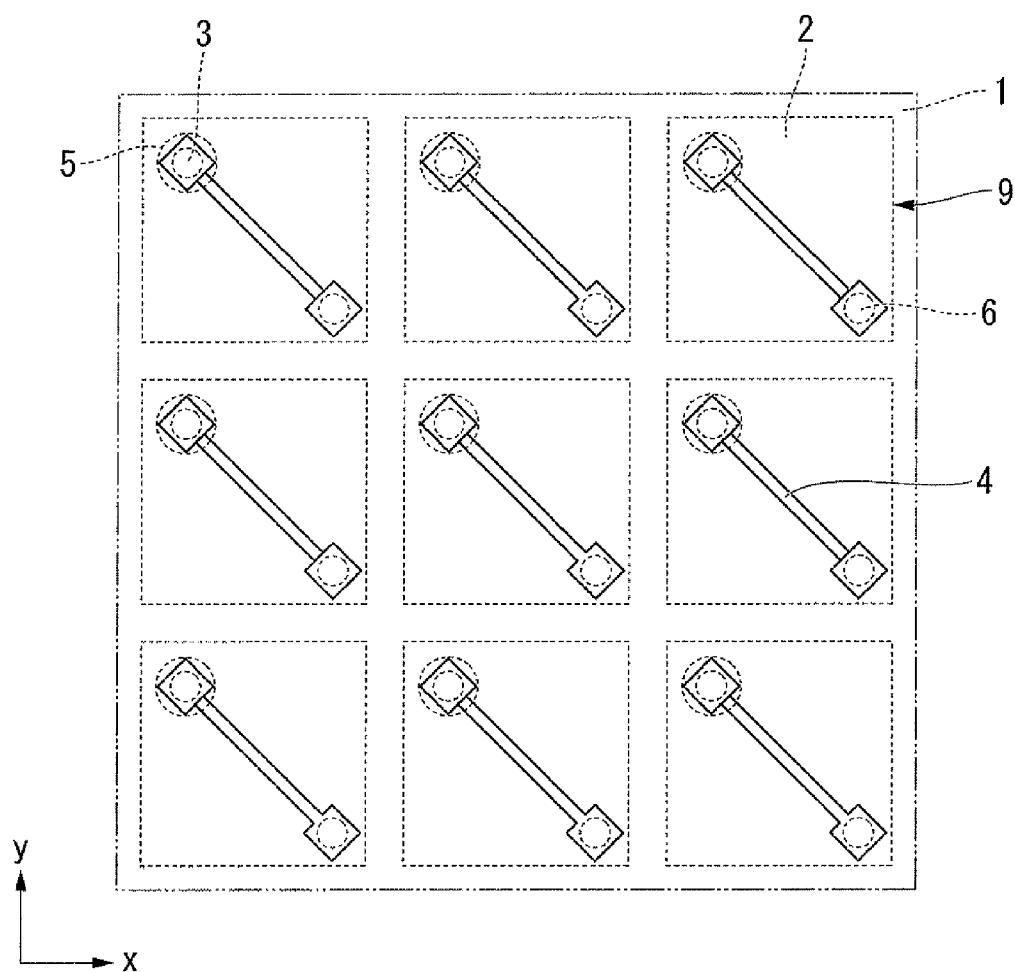
FIG. 7 is a plan view of a modification of the EBG structure according to the first exemplary embodiment of the present invention.

FIG. 1 shows the case where the conductor via 3 and the clearance 5 are provided in the center portion of the conductor patch 2. However, in the case of providing the conductor via 3 and the clearance 5 at another portion of the conductor patch 2, the essential effect of the exemplary embodiment of the present invention is not affected at all. For example, as shown in FIG. 7, in the case of providing the conductor via 3 and the clearance 5 in a corner of the conductor patch 2, it is possible to secure the transmission line length d even if the transmission line 4 has a linear shape.

FIG. 1 shows an example of a tetragonal lattice of A=(a, 0), B=(0, a), as a lattice in which a unit structure is periodically arranged. However, the lattice shape is not necessarily restricted to a tetragonal lattice. It is possible to obtain a similar effect even if the lattice shape is a triangular lattice or one-dimensional periodic array.

FIG. 1 shows the case of the conductor patch 2 having a square shape. However, provided it is a shape in which the desired capacitance is produced between adjacent conductor patches 2, the essential effect of the exemplary embodiment of the present invention is not affected at all even if the shape of the conductor patch 2 is an equilateral triangle, a regular hexagon, or another shape.

Here, the structure of the exemplary embodiment of the present invention shall be described, paying attention to its function as an EBG. Looking at FIG. 4, on the low region side and high region side of the band gap band, both Im (Z) and Im (Y) are negative, therefore the EBG structure of the exemplary embodiment of the present invention operates as a left-handed medium in this frequency region. Accordingly, it is naturally possible to utilize the structure of the exemplary embodiment of the present invention as a left-handed resonator or left-handed antenna by arranging it two dimensionally and utilize the structure of the exemplary embodiment of the present invention as a left-handed transmission line by arranging it one dimensionally. Even in this case, since it is possible to control admittance by the structure of the exemplary embodiment of the present invention without increasing the thickness of the structure, it is possible to achieve a thin left-handed medium.

Next, an EBG structure according to the second exemplary embodiment of the present invention shall be described.

The first exemplary embodiment shows a configuration example using a short stub that consists of the transmission line 4 and the short-circuit via 6 in the admittance portion. In view of the essential principle of the exemplary embodiment of the present invention, namely, utilizing the impedance conversion effect that relies on the transmission line length to achieve a band gap in a specified frequency band, it is possible to consider a constitution that uses an open stub instead of a short stub that consists of the transmission line 4 and the short-circuit via 6. Even in the case of using an open stub, the state of LC parallel resonance is realized by the impedance conversion effect that relies on the transmission line length in the exact same manner as the case of the short stub. For this reason, it is possible to produce a band gap in the desired frequency band by adjusting the transmission line length.

Figure 8:
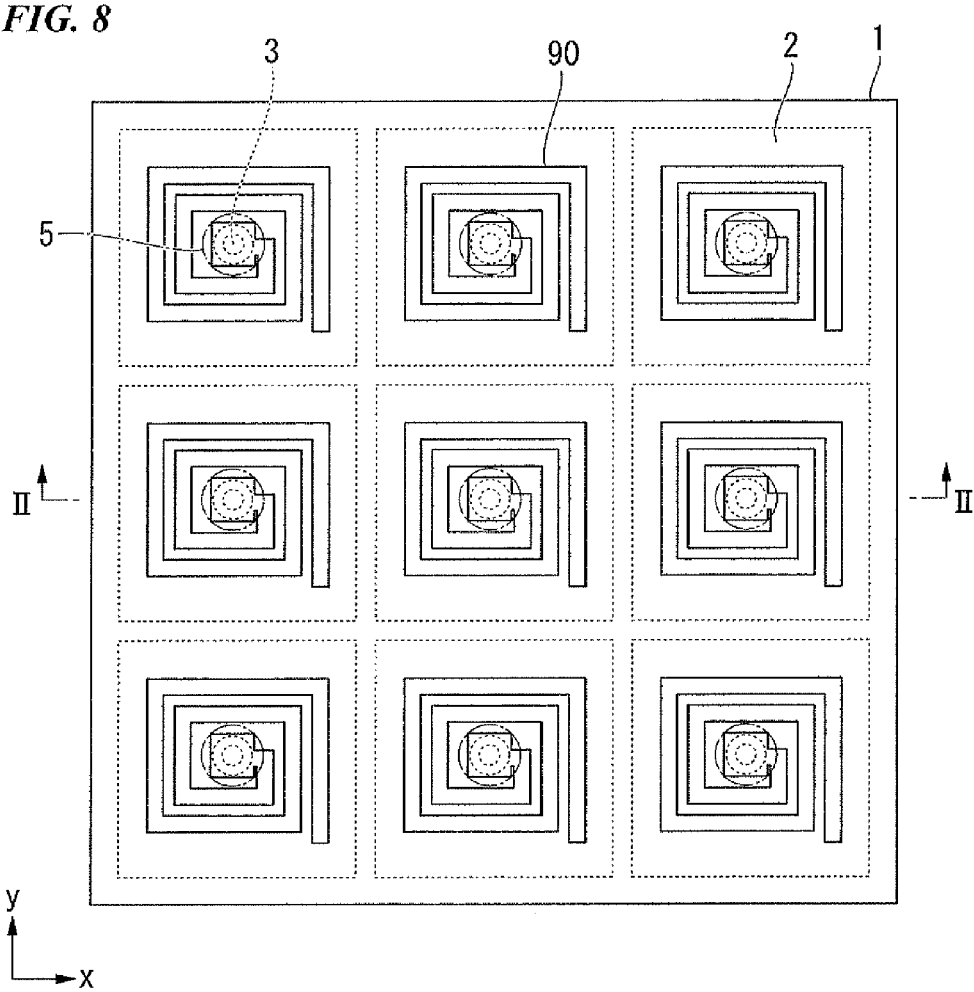
FIG. 8 is a plan view of the EBG structure according to a second exemplary embodiment of the present invention.
Figure 9:
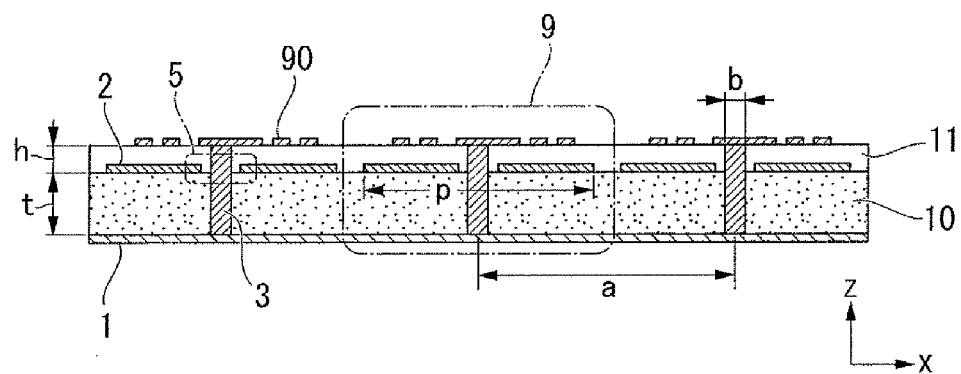
FIG. 9 is a cross-sectional view of the EBG structure according to the second exemplary embodiment of the present invention, being a cross-sectional view along line II-II in FIG. 8.

FIG. 8 is a plan view of the EBG structure of the second exemplary embodiment. FIG. 9 is a cross-sectional view along line II-II in FIG. 8. In FIG. 8, for convenience of description, the conductor plane 1 and the conductor patch 2 are illustrated with the first dielectric layer 10 and the second dielectric layer 11 made transparent. The EBG structure of the second exemplary embodiment applies an open stub in place of the short stub in the EBG structure of the first exemplary embodiment.

As shown in FIG. 8, in the EBG structure of the second exemplary embodiment, an open end transmission line 90 is provided in place of the transmission line 4, and the short-circuit via 6 is not provided. The planar shape of the open end transmission line 90 is a spiral shape. If the planar shape is a spiral shape, the ratio of the transmission line length d to the mounting area of the open end transmission line 90 is higher compared to the case of being a linear shape.

The open end transmission line 90 conducts electricity by the center portion of the spiral shape being in contact with the conductor via 3, and is connected with the conductor plane 1 via the conductor via 3. The end portion on the outer periphery of the spiral shape is an open end. The open end transmission line 90 is constituted so as to function as an open stub that makes the conductor patch 2 serve as a return path. The EBG structure of the second exemplary embodiment is the same as the EBG structure of the first exemplary embodiment, except for the point of changing the short stub to the open stub.

Figure 10:
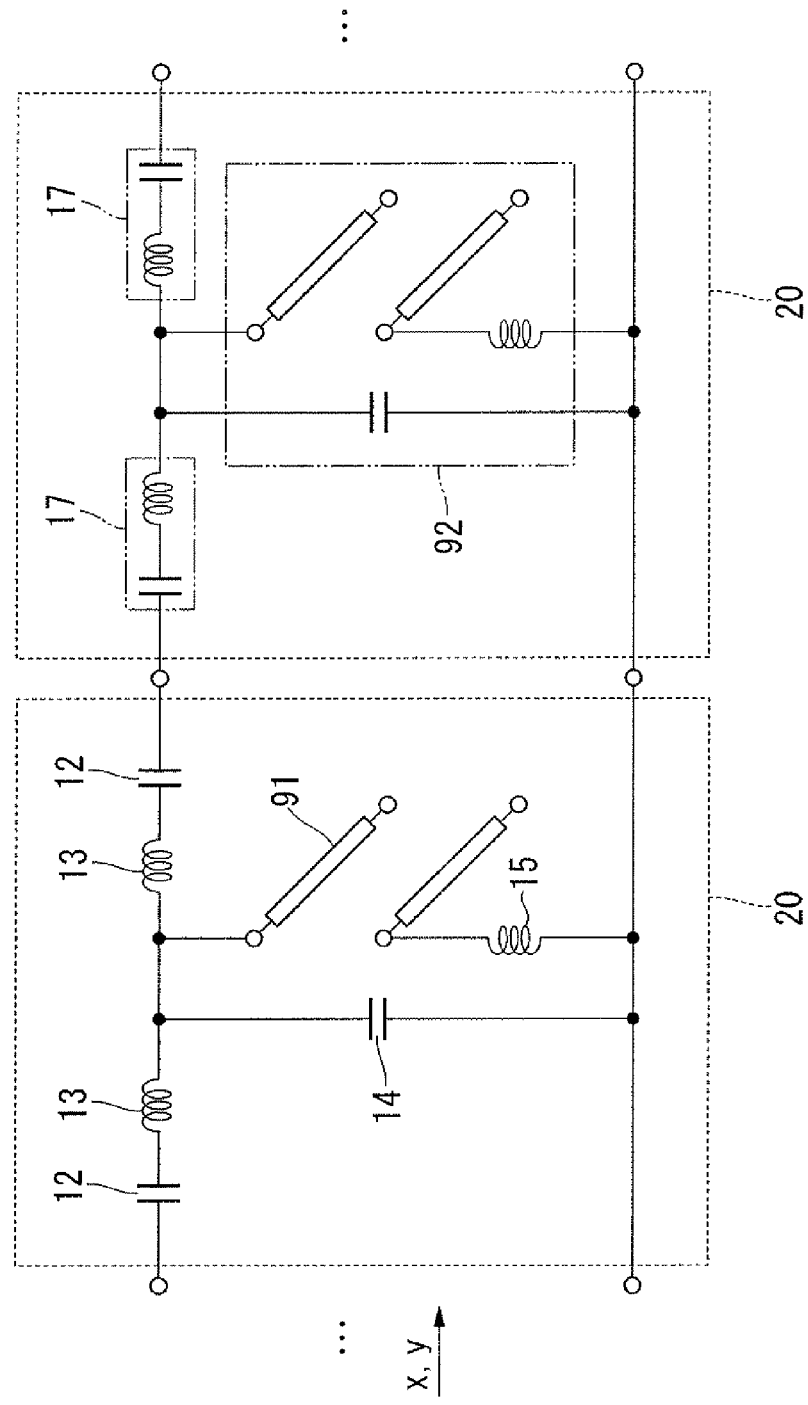
FIG. 10 is an equivalent circuit schematic with respect to electromagnetic waves that propagate in an x-axis direction or a y-axis direction.

FIG. 10 is an equivalent circuit diagram with respect to electromagnetic waves that propagate in the x-axis direction or the y-axis direction. As shown in FIG. 10, compared with the equivalent circuit diagram shown in FIG. 3, the equivalent circuit of the EBG structure of the second exemplary embodiment is a circuit configuration in which an open stub 91 that is constituted including the open end transmission line 90 in place of the short stub 16 created by the transmission line 4 and the short-circuit via 6 is connected.

The admittance Y of an admittance portion 92 is given by the following Equation (7) and Equation (8).

[Equation 7]

$$Y = \frac{Z_{in} - i\omega L_{via}}{Z_{in}^2 + \omega^2 L_{via}^2} + i\omega C_R \quad (7)$$

[Equation 8]

$$Z_{in} = \frac{iZ_0}{\tan(\beta d)}, \beta = \omega\sqrt{\varepsilon_{eff}\varepsilon_0\mu_0} \quad (8)$$

In Equation (8), $Z_0$ is the characteristic impedance of the open end transmission line 90, and d is the transmission line length of the open end transmission line 90. $\varepsilon_0$ expresses the permittivity of a vacuum, $\mu_0$ the permeability, and $\varepsilon_{eff}$ expresses the effective relative permittivity of the open end transmission line 90. The open end transmission line 90 can be considered as a microstrip line, similarly to the first exemplary embodiment. Accordingly, in relation to the characteristic impedance of the open end transmission line 90, it can be found using Equation (4), Equation (5) or the like. In relation to the effective permittivity, it can be found by using an approximate expression such as Equation (6), for example. Since the principle in which the band gap occurs is the same as for the first exemplary embodiment, the description thereof shall be omitted.

In this way, even in a configuration using an open stub, it is possible to find the characteristics of the EBG structure using well-known equations, similarly to an exemplary embodiment that uses a short stub. Therefore, for the same reasons as the first exemplary embodiment, it is possible to accurately and readily design the band gap band, and it is possible to make the EBG structure thin by lengthening the transmission line length d.

The open end transmission line 90 is only required to be connected to the conductor via 3 and have an open end, and the arrangement and shape thereof can be suitably modified. The second exemplary embodiment shows as an example an exemplary embodiment in which the planar shape of the open end transmission line 90 is a spiral shape, but as described in the first exemplary embodiment, a constitution may be adopted in which the planar shape of the open end transmission line 90 has a linear shape or a meander shape.

Although the second exemplary embodiment showed as an example a constitution that provides the conductor via 3 and the clearance 5 in the center portion of the conductor patch 2, suitable modifications are possible to the relative position of the conductor via 3 and the clearance 5 with respect to the conductor patch 2. For example, when the conductor via 3 and the clearance 5 are provided in the corner of the conductor patch 2 as shown in FIG. 7 in the first exemplary embodiment, even in the case of the planar shape of the open end transmission line 90 being a linear shape, it is possible to secure the transmission line length d. In this way, even in the case of changing the relative position of the conductor via 3 and the clearance 5 with respect to the conductor patch 2, it is possible to obtain the effect of the exemplary embodiment of the present invention.

The second exemplary embodiment showed as an example a tetragonal lattice of A=(a, 0), B=(0, a), as a lattice in which a unit structure is periodically arranged. However, the lattice shape may also be, for example, a triangular lattice or one-dimensional periodic array. As the planar shape of the conductor patch 2, although a square was shown as an example, the planar shape may also be a shape other than square, such as an equilateral triangle, a regular hexagon, or the like. Even in the case of changing the arrangement and planar shape of the conductor patch 2, provided the desired capacitance is produced between adjacent conductor patches 2, it is possible to obtain the effect of the exemplary embodiment of the present invention.

Next, an EBG structure according to the third exemplary embodiment of the present invention shall be described.

Figure 11:
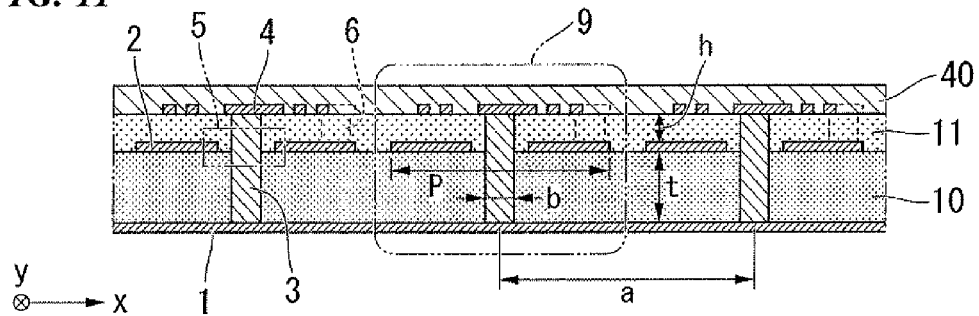
FIG. 11 is a cross-sectional view of the EBG structure of a third exemplary embodiment.

FIG. 11 is a cross-sectional view of the EBG structure according to the third exemplary embodiment. The first exemplary embodiment showed the case of no structure existing on the upper portion of the transmission line 4, but as shown in FIG. 11, there may also be a structure on the upper portion of the transmission line 4. In the third exemplary embodiment, a third dielectric layer 40 is provided as a dielectric body that covers the transmission line 4 on the upper portion of the transmission line 4 of the first exemplary embodiment. By providing the third dielectric layer 40 in this way, it is possible to increase the effective relative permittivity $\in_{\it eff}$ of the transmission line 4. According to Equation (3), the greater the effective relative permittivity, the more notable the impedance conversion effect in the transmission line. Therefore, it is possible to lower the frequency of the band gap band without lengthening the transmission line length d. Accordingly, in the case of aiming to lower the frequency of the band gap band, it is preferable to use a dielectric material with a large relative permittivity as the third dielectric layer 40. It is of course also possible to provide the third dielectric layer 40 in the EBG structure of the second exemplary embodiment.

Next, an EBG structure according to the fourth exemplary embodiment of the present invention shall be described.

Figure 12:
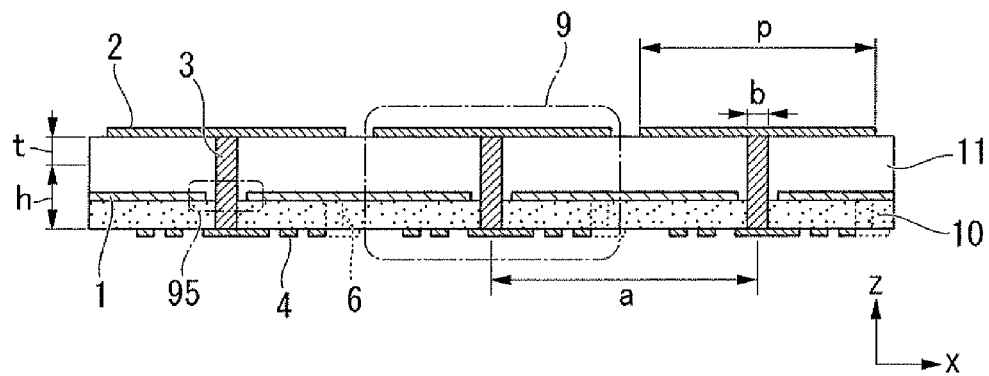
FIG. 12 is a cross-sectional view of the EBG structure of a fourth exemplary embodiment.

FIG. 12 is a cross-sectional view of the EBG structure according to the fourth exemplary embodiment of the present invention. In the cross-section shown in FIG. 12, the short-circuit via 6 is not precisely included, but for convenience of description, the short-circuit via 6 is shown by a dotted line.

The EBG structure of the fourth exemplary embodiment has a constitution in which one conductor plane of the first conductor plane (conductor plane 1) and the second conductor plane (conductor patch 2) is the conductor plane 1, and the other conductor plane is the conductor patch 2. That is, the transmission line 4 is arranged on the opposite side of the other conductor plane (conductor patch 2) with respect to the one conductor plane (conductor plane 1).

The EBG structure of the fourth exemplary embodiment as shown in FIG. 12 includes the first dielectric layer 10 and the second dielectric layer 11 arranged on one surface of the first dielectric layer 10. The conductor plane 1 is arranged on a layer that is sandwiched by the first dielectric layer 10 and the second dielectric layer 11. A plurality of the conductor patches 2 are arranged abutting the surface of the second dielectric layer 11 that is opposite the surface that abuts the first dielectric layer 10. The transmission line 4 is disposed abutting the surface of the first dielectric layer 10 that is opposite the surface that abuts the conductor plane 1.

The conductor via 3 is provided in a manner passing through the first dielectric layer 10, the conductor plane 1, and the second dielectric layer 11. At the portion of the conductor plane 1 that intersects with the conductor via 3, an opening is provided of a larger diameter than the outer diameter of the conductor via 3, and a clearance 95 is constituted. The conductor via 3 is arranged in this opening, so as not make contact with the conductor plane 1.

The transmission line 4 is electrically connected to the conductor patch 2 via the conductor via 3.

The short-circuit via 6 is provided in a manner passing through the first dielectric layer 10. The transmission line 4 is electrically connected with the conductor patch 2 via the short-circuit via 6. The transmission line 4 is constituted so as to function as a short stub that uses conductor plane 1 as a return path.

The equivalent circuit of the EBG structure with the above constitution is the same as the equivalent circuit shown in FIG. 3, and operates in a similar manner as the EBG structure of the first exemplary embodiment. In the EBG structure of the fourth exemplary embodiment, due to the reasons explained in the first exemplary embodiment, it is possible to accurately and readily design a band gap band, and also possible to make the EBG structure thinner by lengthening the transmission line length d.

The EBG structure of the fourth exemplary embodiment may also have a constitution in which a third dielectric layer is provided covering the transmission line 4, similarly to the third exemplary embodiment.

Next, an EBG structure according to the fifth exemplary embodiment of the present invention shall be described.

Figure 13:
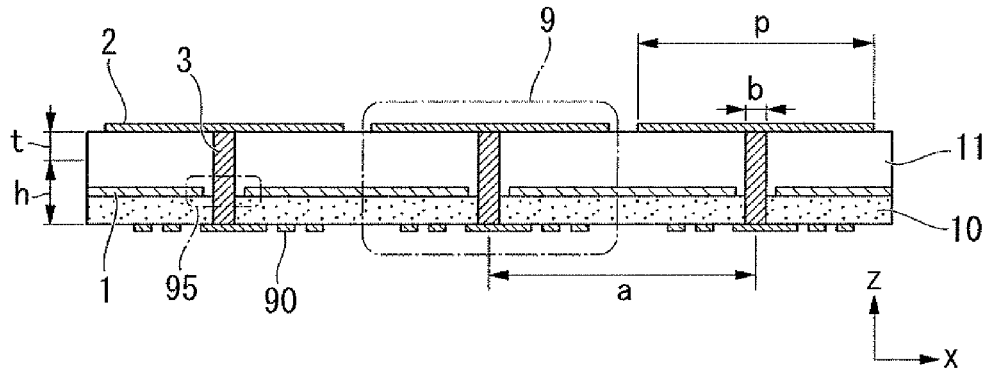
FIG. 13 is a cross-sectional view of the EBG structure of a fifth exemplary embodiment.

FIG. 13 is a cross-sectional view of the EBG structure according to the fifth exemplary embodiment. An open stub is applied instead of a short stub in the EBG structure of the fourth exemplary embodiment. In the EBG structure of the fifth exemplary embodiment as shown in FIG. 13, the open end transmission line 90 is provided in place of the transmission line 4 of the EBG structure of the fourth exemplary embodiment, and the short-circuit via 6 is not provided.

The open end transmission line 90 conducts electricity by the center portion of the spiral shape being in contact with the conductor via 3, and is connected with the conductor patch 2 via the conductor via 3. The end portion on the outer periphery of the spiral shape in the open end transmission line 90 is an open end. The open end transmission line 90 is constituted so as to function as an open stub that makes the conductor plane 1 serve as a return path. The EBG structure of the fifth exemplary embodiment is the same as the EBG structure of the fourth exemplary embodiment, except for the point of changing the short stub to the open stub.

The equivalent circuit of the EBG structure of the fifth exemplary embodiment is the same as the equivalent circuit shown in FIG. 10, and operates in the same manner as the EBG structure of the second exemplary embodiment. In the EBG structure of the fifth exemplary embodiment, due to the same reason as the second exemplary embodiment, it is possible to accurately and readily design a band gap band, and also possible to make the EBG structure thinner by lengthening the transmission line length d.

The EBG structure of the fifth exemplary embodiment may also have a constitution in which a third dielectric layer is provided covering the transmission line 4, similarly to the third exemplary embodiment.

Next, a printed circuit board of the sixth exemplary embodiment of the present invention shall be described.

Figure 14A:
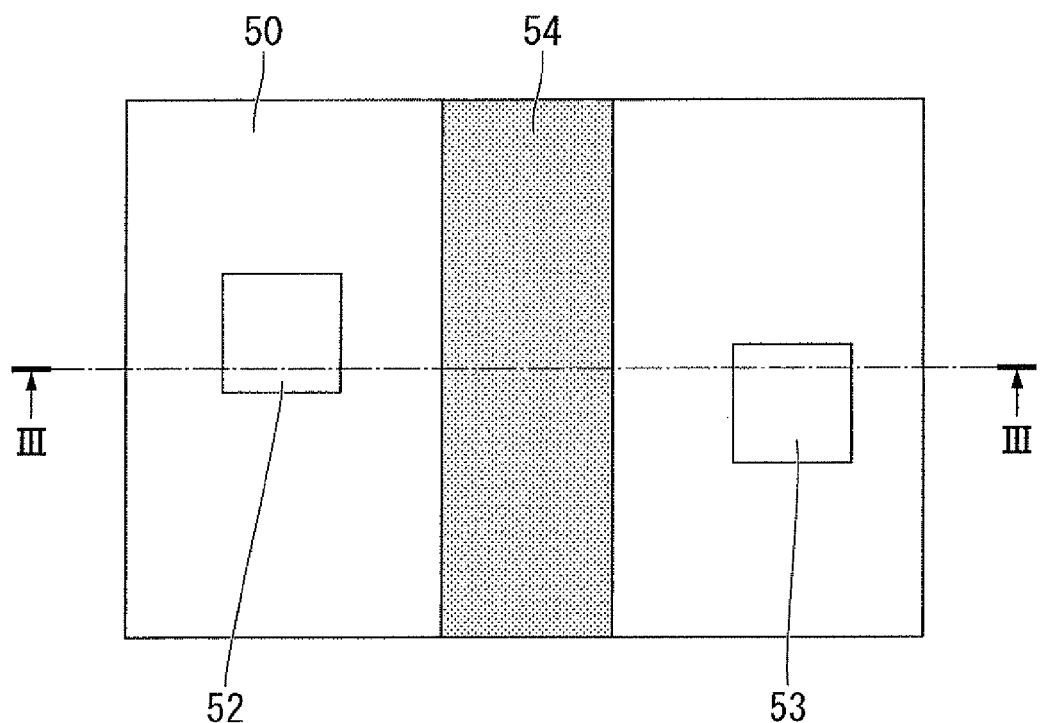
FIG. 14A is a plan view showing a printed circuit board of a sixth exemplary embodiment of the present invention.
Figure 14B:
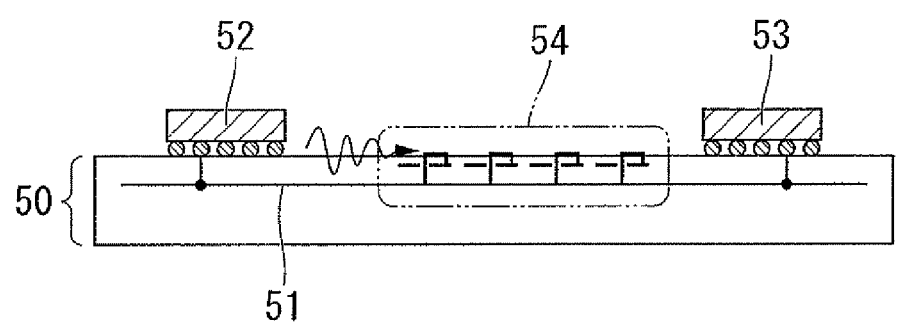
FIG. 14B is a cross-sectional view along line III-III in FIG. 14A.

FIG. 14A is a plan view showing an example of the printed circuit board that includes the EBG structure of an exemplary embodiment of the present invention. FIG. 14B is a cross-sectional view along line III-III in FIG. 14A. A printed circuit board 50 that is shown in FIG. 14A and FIG. 14B includes at least a ground plane 51, a device 52 that is a noise source, a device 53 that is easily affected by the noise, and an EBG region 54 that is arranged between those devices. As shown in FIG. 14B, the device 52 that is the noise source and the device 53 that is easily affected by the noise are both connected to the ground plane 51. The ground plane 51 and the dielectric portion of the printed circuit board 50 form a type of surface waveguide. The noise that is generated from the device 52, which is the noise source, propagates through the surface waveguide and enters the device 53, which is easily affected by the noise, and thus may become a factor that causes malfunction and the like. In the printed circuit board of the sixth exemplary embodiment, by arranging the EBG structure of the present invention in the EBG region 54 so as to block the noise propagation path as shown in FIG. 14A, it is possible to inhibit noise propagation between the devices. Thereby, it is possible to inhibit malfunctioning of the device 53, which is easily affected by the noise.

Figure 15:
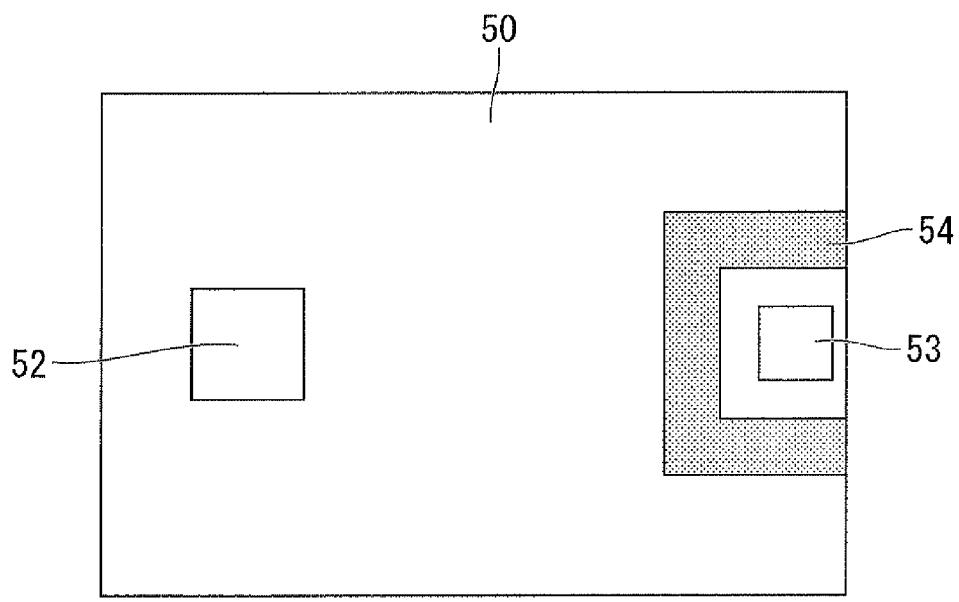
FIG. 15 is a plan view of a modification of the printed circuit board of the sixth exemplary embodiment of the present invention.

FIG. 14A shows the case of the EBG region 54 being provided in a band shape, but provided the EBG region is capable of blocking the noise propagation path, it may be disposed in any configuration. For example, it is possible to provide the EBG region 54 so as to surround the device 53, which is easily affected by the noise, as shown in FIG. 15. The EBG structure that is arranged in the EBG region 54 may be any one of the EBG structures according to the exemplary embodiments of the present invention.

Here, the case of mounting the EBG structure of an exemplary embodiment of the present invention on a printed circuit board is shown, but the object of the exemplary embodiment of the present invention is not necessarily limited to a printed circuit board. For example, it is also conceivable to provide the EBG structure of an exemplary embodiment of the present invention on a package substrate or the like of a device. It is of course also possible to provide the EBG structure of an exemplary embodiment of the present invention using a fine wiring process on a semiconductor device including silicon.

In the case of the devices being, for example, antennas, if a structure according to an exemplary embodiment of the present invention is provided to block the propagation path of electromagnetic waves between the antennas, it is possible to inhibit unwanted coupling of the antennas.

Next, an antenna according to the seventh exemplary embodiment of the present invention shall be described.

Figure 16:
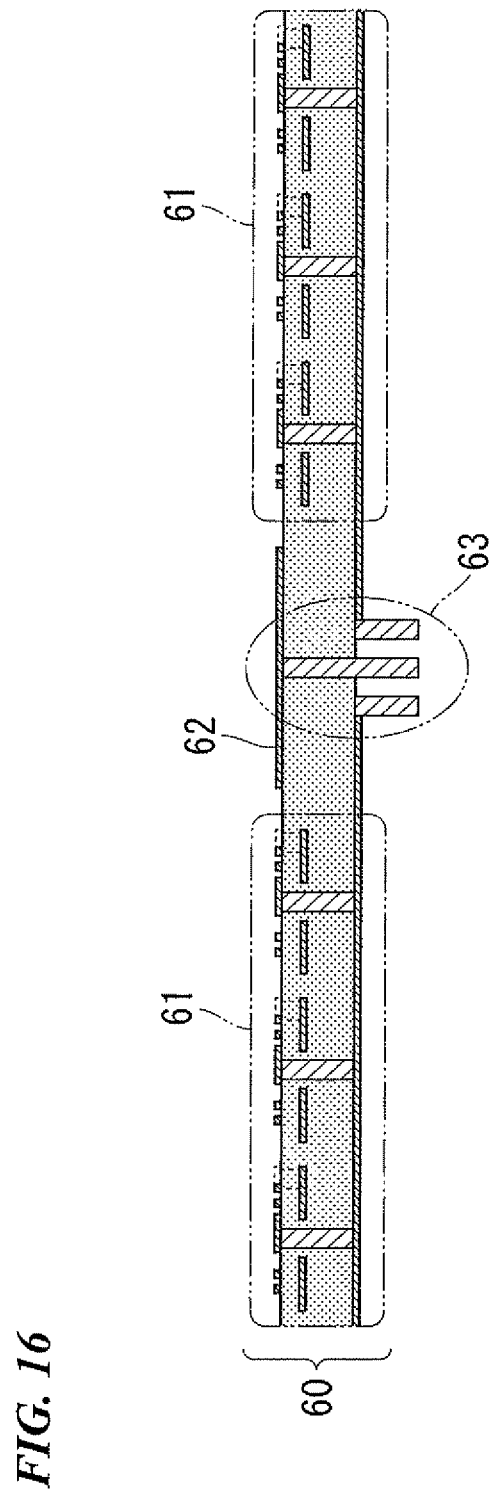
FIG. 16 is a cross-sectional view of a patch antenna of a seventh exemplary embodiment of the present invention.

FIG. 16 is an example of a patch antenna that uses the EBG structure of an exemplary embodiment of the present invention as a reflecting plate. A patch antenna 60 is constituted by an EBG structure 61 serving as a reflecting plate, an antenna element 62 and a power supply line 63. By designing the band gap band of the EBG structure in accordance with the working frequency band of the patch antenna, surface waves that propagate from the patch antenna along the reflecting plate surface and wrap around to the back surface are inhibited. For this reason, back radiation is inhibited, and it becomes possible to avoid degradation of the antenna characteristics.

Figure 17:
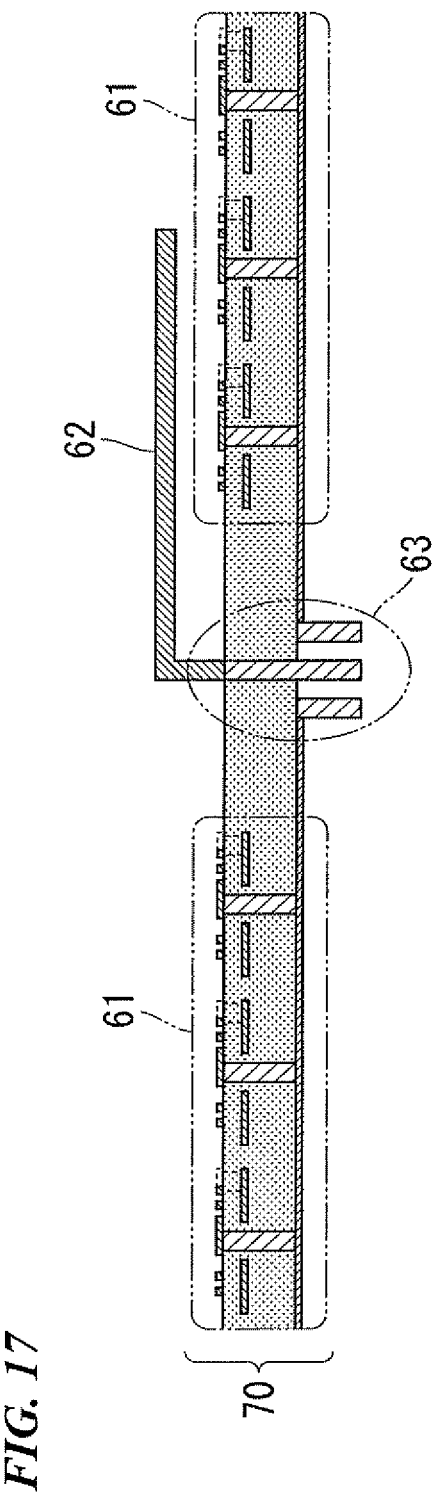
FIG. 17 is a view that shows a modification of the fourth exemplary embodiment of the present invention, being a cross-sectional view that shows a reverse L-shaped antenna.

As shown in FIG. 17, it is possible to conceive a reverse L-shaped antenna 70 that uses the EBG structure of an exemplary embodiment of the present invention as a reflecting plate. In the reverse L-shaped antenna 70 shown in FIG. 17, in addition to the back radiation being inhibited in the same manner as the case of the patch antenna, since the EBG structure 61 reflects electromagnetic waves in-phase, the antenna element 62 can be disposed close to the surface of the EBG structure 61. Thereby, it is possible to achieve a thin reverse L-shaped antenna 70.

Here, the case of a patch antenna and a reverse L-shaped antenna serving as the antennas is described as an example, but of course it is possible to utilize the effect of the exemplary embodiment of the present invention in just the same way for another antenna. As the EBG structure 61, any of the EBG structures of the exemplary embodiments of the present invention may be applied.

Next, a transmission line to waveguide converter according to the eight exemplary embodiment of the present invention shall be described.

Figure 18:
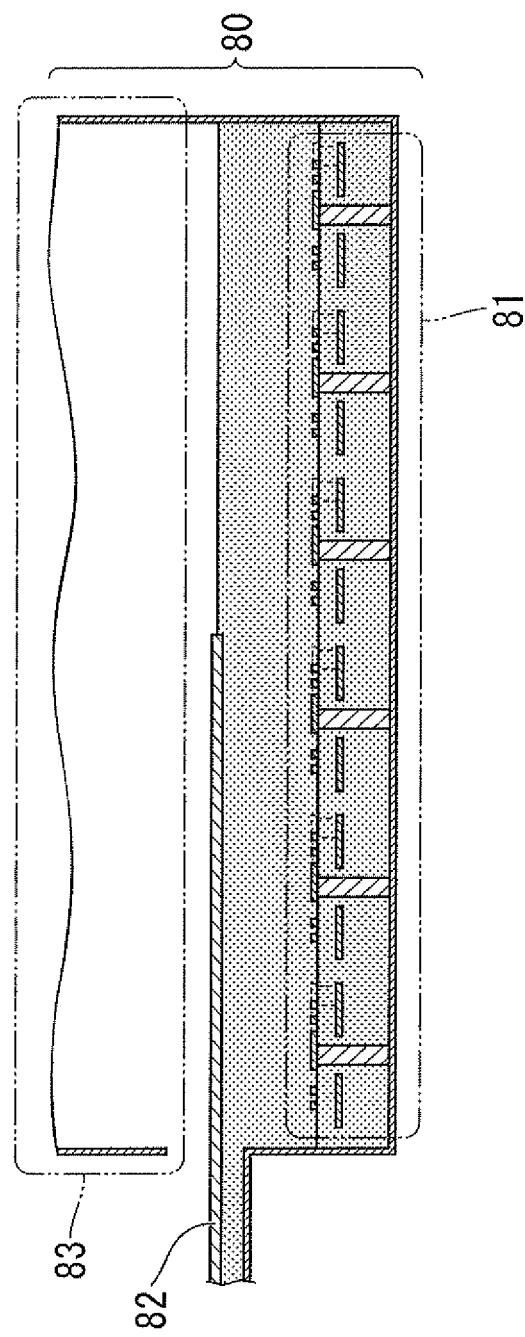
FIG. 18 is a cross-sectional view of the transmission line to waveguide converter of the fifth exemplary embodiment of the present invention.

FIG. 18 is an example of a transmission line to waveguide converter that uses the EBG structure of an exemplary embodiment of the present invention as a reflecting plate. A transmission line to waveguide converter 80 is constituted from an EBG structure 81 serving as a reflecting plate, a transmission line 82, and a waveguide 83. By designing the band gap band of the EBG structure 81 in accordance with the working frequency band, since the EBG structure 81 reflects electromagnetic waves in-phase, the transmission line 82 can be disposed close to the surface of the EBG structure 81. Thereby, it is possible to achieve a thin transmission line to waveguide converter.

As the EBG structure 81, any of the EBG structures of the exemplary embodiments of the present invention may be applied.

In the first to eighth exemplary embodiments, descriptions were given with attention paid to operation of the structure of the exemplary embodiments of the present invention as an EBG, but as described in the first exemplary embodiment, the structure of the exemplary embodiment of the present invention operates as an EBG or left-handed medium depending on the operation frequency. Also, referring to FIG. 4, a frequency band exists in which both Im (Z) and Im (Y) are positive, and it is evident that it operates as a right-handed medium in this frequency. A structure that functions as a right-handed medium or a left-handed medium depending on the operation frequency, such as the structures of the exemplary embodiments of the present invention, is sometimes called a composite right and left handed (simply referred to as CRLH) transmission line.

Technology has been proposed that miniaturizes the antenna by utilizing the line-length resonance in the left-handed frequency region of this CRLH transmission line. In an ordinary medium (right-handed medium), the lower the frequency, the longer the wavelength of the electromagnetic wave, leading to the problem of the structure of the antenna increasing in size. However, in a left-handed medium, the lower the frequency, the shorter the wavelength of the electromagnetic wave, so it is possible to achieve a reduction in size of the antenna.

In the following exemplary embodiment, a description is given for a constitution in which the structure of an exemplary embodiment of the present invention operates as a CRLH transmission line. The antenna of the ninth exemplary embodiment described next is an antenna that is reduced in size by using the structure of an exemplary embodiment of the present invention that operates as a CRLH transmission line.

Figure 19:
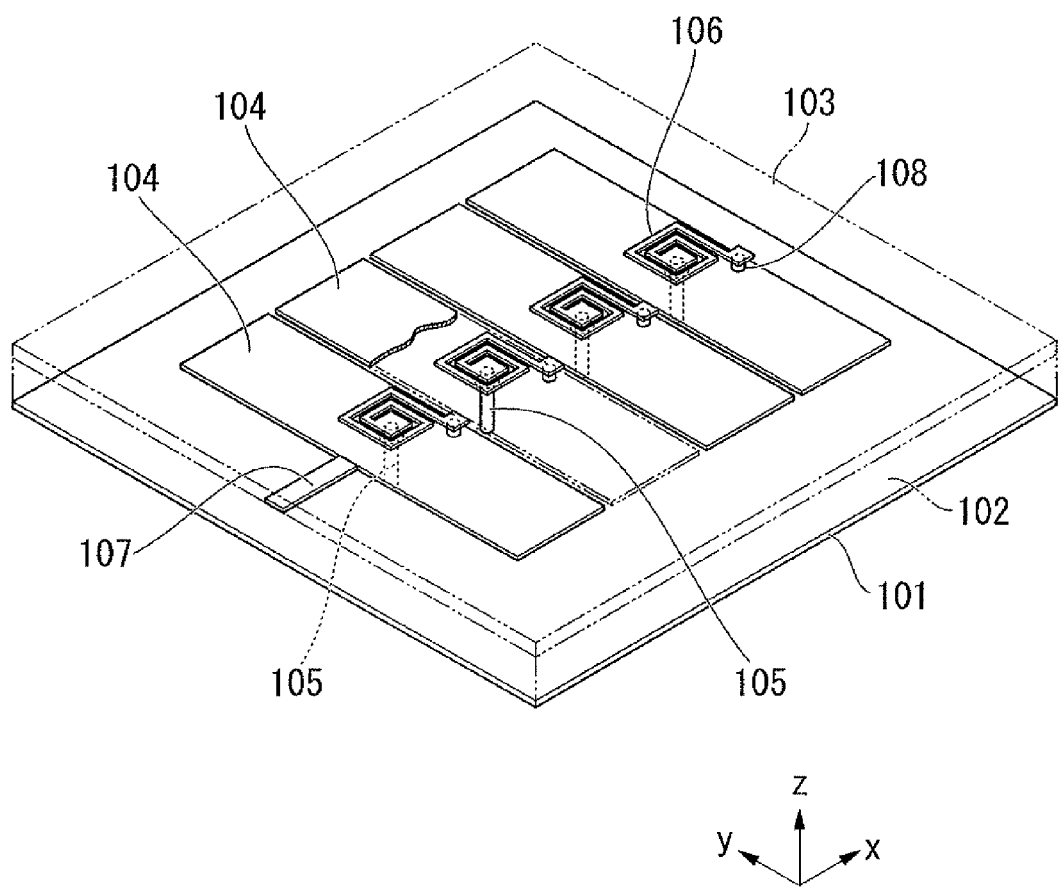
FIG. 19 is a perspective view of the antenna of the ninth exemplary embodiment of the present invention.
Figure 20:
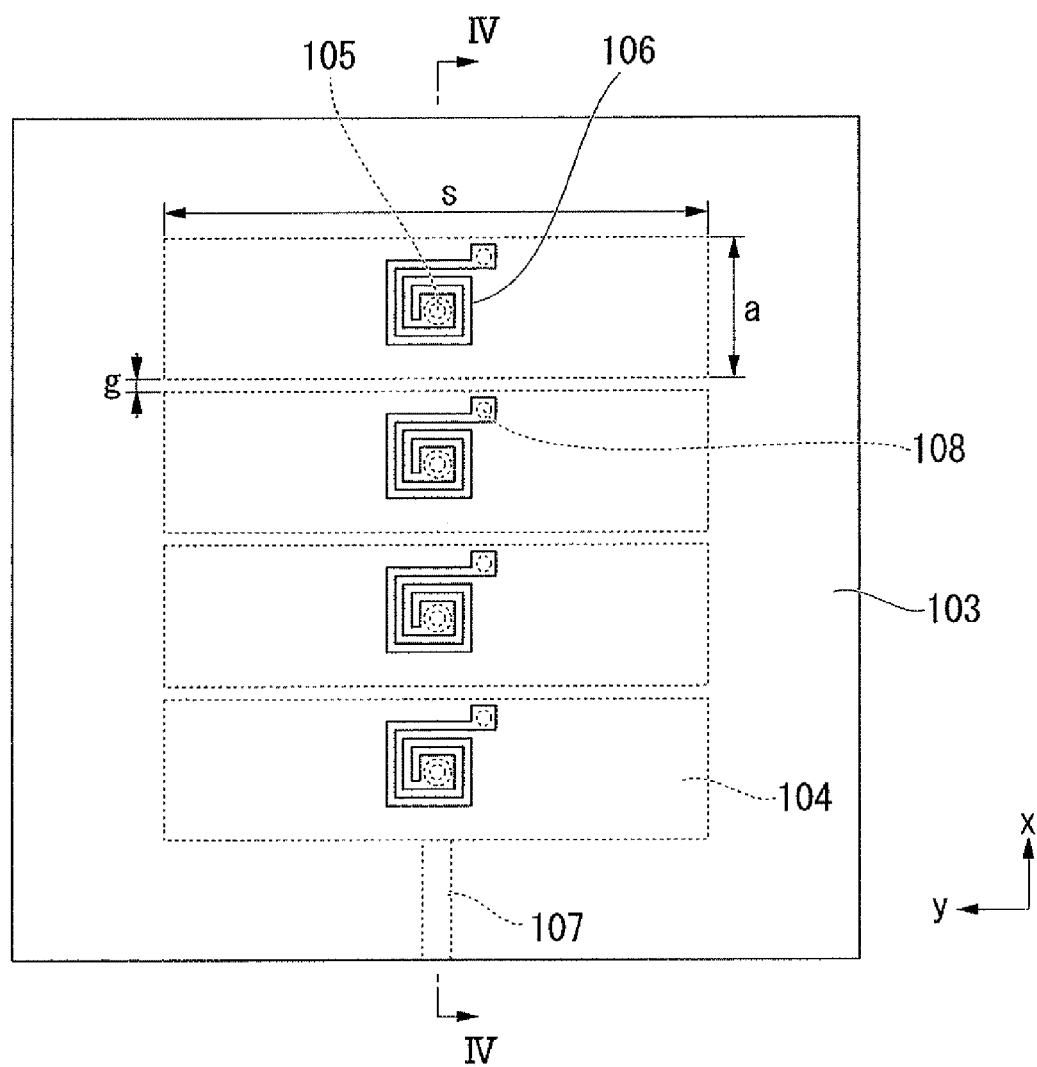
FIG. 20 is a plan view of the antenna of the ninth exemplary embodiment viewed from a z-axis positive direction.
Figure 21:
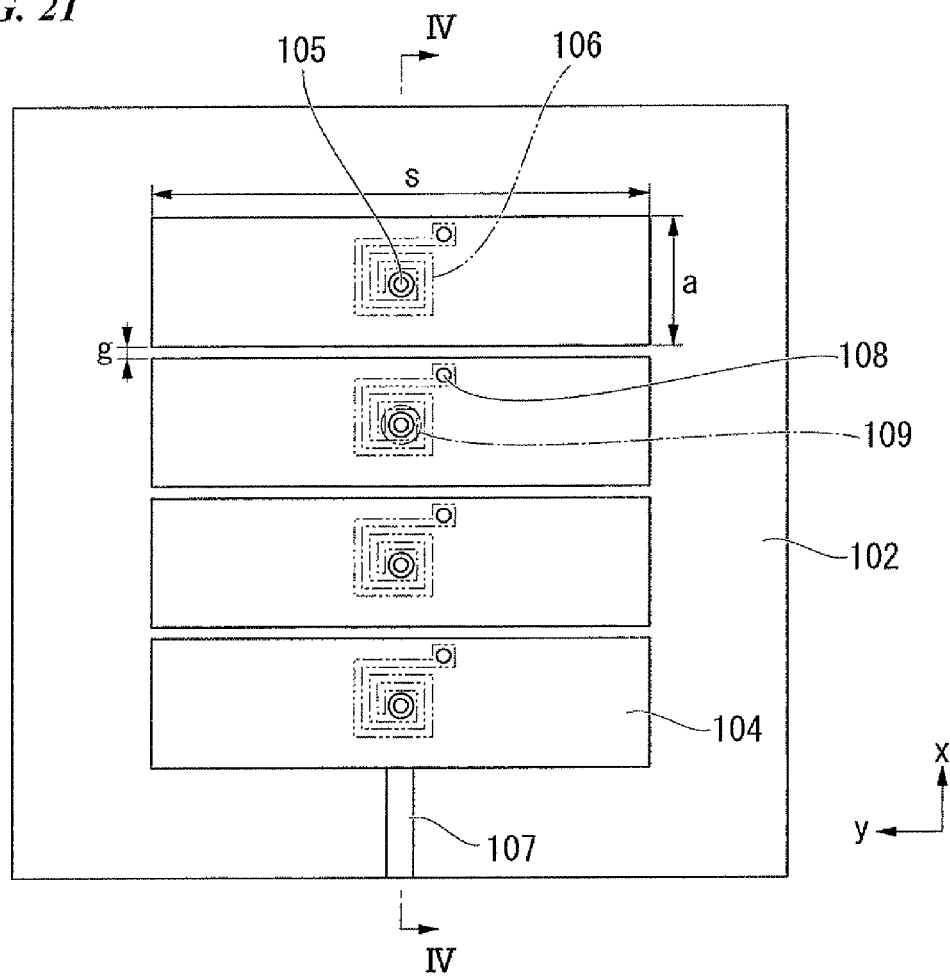
FIG. 21 is a plan view with the transmission line in FIG. 20 made visible.
Figure 22:
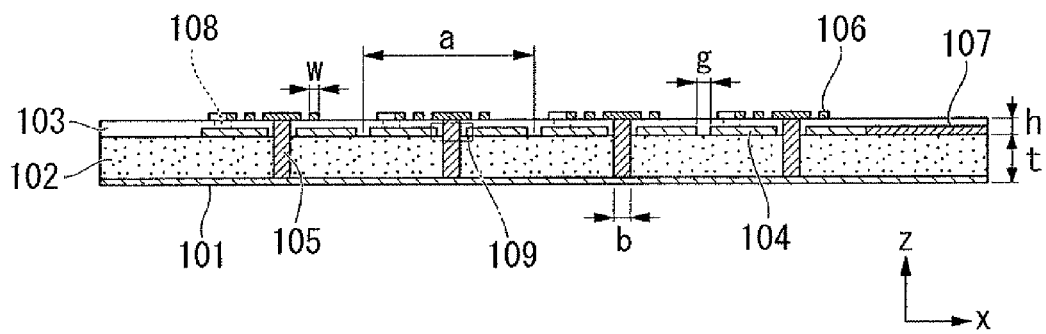
FIG. 22 is a cross-sectional view along line IV-IV in FIG. 20 and FIG. 21.

FIG. 19 is a perspective view that shows the antenna according to the ninth exemplary embodiment of the present invention. In FIG. 19, for convenience of description, the internal structure is shown with a portion of the constituent elements being transparent. FIG. 20 is a plan view of the antenna of the ninth exemplary embodiment, viewed from the z-axis positive direction. FIG. 21 is a plan view of the antenna of the ninth exemplary embodiment, viewed from the z-axis positive direction, with the transmission lines 106 made visible. FIG. 22 is a cross-sectional view along line IV-IV of FIG. 20 and FIG. 21. Although a short-circuit via 108 is not precisely included in FIG. 22 at the cross-sectional plane IV-IV of FIG. 20 and FIG. 21, for convenience of description, the short-circuit via 108 is indicated by a dotted line.

The antenna according to the ninth exemplary embodiment as shown in FIG. 22 includes the structure according to an exemplary embodiment of the present invention. The structure in the ninth exemplary embodiment has a constitution in which one conductor plane of the first conductor plane (conductor plane 101) and the second conductor plane (conductor patch 104) is a conductor patch 104, and the other conductor plane is a conductor plane 101. That is, the transmission line 106 is arranged on the opposite side of the other conductor plane (conductor plane 101) with respect to the one conductor plane (conductor patch 104).

The antenna of the ninth exemplary embodiment includes a first dielectric layer 102, and a second dielectric layer 103 that is arranged on one surface of the first dielectric layer 102. A plurality of the conductor patches 104 are arranged in the layer that is sandwiched by the first dielectric layer 102 and the second dielectric layer 103. The plurality of conductor patches 104 have a planar shape that is approximately rectangular, and are arranged in one-dimension by being lined up in the x-axis direction. On the same layer as the plurality of conductor patches 104, a microstrip line 107 that constitutes the feed portion is arranged.

The microstrip line 107 conducts by making contact with the conductor patch 104 that is positioned furthest to the end among the plurality of conductor patches 104. The microstrip line 107 is extended in the x-axis direction, and is electrically connected to a wireless circuit or the like not illustrated. Electrical signals that are supplied from the wireless circuit or the like are transmitted to the conductor patches 104 via the microstrip line 107.

The transmission line 106 is arranged abutting the surface of the second dielectric layer 103 that is opposite the surface that abuts the conductor patch 104. The conductor plane 101 is arranged abutting the surface of the first dielectric layer 102 that is opposite the surface that abuts the conductor patch 104.

A conductor via 105 is provided in a manner passing through the first dielectric layer 102, the conductor patch 104, and the second dielectric layer 103. At the portion of the conductor patch 104 that intersects with the conductor via 105, an opening is provided of a larger diameter than the outer diameter of the conductor via 105, and a clearance 109 is constituted. The conductor via 105 is arranged in this opening in the clearance 109, so as not make contact with the conductor patch 104. The transmission line 106 is electrically connected to the conductor plane 101 via the conductor via 105.

The short-circuit via 108 is provided in a manner passing through the second dielectric layer 103. The transmission line 106 is electrically connected with the conductor patch 104 via the short-circuit via 108. The transmission line 106 and the short-circuit via 108 are constituted so as to function as a short stub that uses conductor patch 104 as a return path.

The antenna of the ninth exemplary embodiment includes a periodic structure in which a unit structure that corresponds to the scope indicated by the reference symbol "a" in FIG. 22 is periodically disposed. The unit structure includes the conductor patch 104 in which the clearance 109 is provided, the conductor via 105, the short-circuit via 108, and the transmission line 106. Here, although the unit structure is disposed in one dimension on the conductor plane 101, a constitution is also possible in which the unit structure is disposed in two dimensions on the conductor plane 101. In the periodic structure, the conductor patch 104 is disposed with a gap "g" so as to possess electrical capacitance with an adjacent conductor patch 104.

In the antenna of the ninth exemplary embodiment, the plurality of unit structures that are mutually capacitively coupled operate as a CRLH transmission line. When at least one of the unit structures is electrically excited, a line-length resonance occurs in the CRLH transmission line, and electromagnetic waves are radiated. Here, the unit structure that is connected to the microstrip line 107 is excited by the electrical signal that is supplied via the microstrip line 107, whereby electromagnetic waves come to be radiated.

Here, a description is given for the case of four unit structures arrayed in the x direction, with the dimension in the x direction being "a", as a configuration example of an antenna that utilizes the structure according to an exemplary embodiment of the present invention. In the ninth exemplary embodiment, as shown in FIG. 19 to FIG. 22, the microstrip line 107, as a feed portion, is connected to the conductor patch 104 at the end of the CRLH transmission line. By inputting an electrical signal that is supplied from a wireless circuit not illustrated to the microstrip line 107, it is possible to excite the CRLH transmission line. Here, the constitution of supplying electricity to the conductor patch 104 of the unit structure that is positioned furthest to the end in the periodic array was shown as an example. However, in order to perform impedance matching between the antenna and the feed portion, it is also possible to conceive a constitution that supplies power to the conductor patch 104 of the unit structure that is position other than at the end of the periodic array.

Next, the fundamental operation principle of the antenna according to the exemplary embodiment of the present invention shall be described.

The antenna according to the exemplary embodiment of the present invention can be considered a type of resonator that utilizes the ½ wavelength resonance that occurs in the x-axis direction of the CRLH transmission line. The relation between the wavelength and the frequency in the resonator is determined by the dispersion relation of the medium inside the resonator. For an ordinary dielectric body, the dispersion relation of the relative permittivity ∈ and the relative permeability μ is given by the following Equation (9).

[Equation (9)]

$$\omega = \frac{c_0}{\sqrt{\varepsilon\mu}} k \qquad (9)$$

In Equation (9), $c_0$ is the speed of light in a vacuum, $\omega(=2\pi f)$ is the angular frequency, and $k(=2\pi/\lambda)$ is the wave number. From Equation (4), it is evident that an ordinary dielectric behaves as a right-handed medium in which the wavelength increases as the angular frequency is reduced. The antenna according to the exemplary embodiment of the present invention operates as a CRLH transmission line due to the unit structure being periodically arrayed. In the frequency band of electromagnetic waves that are radiated from the antenna, the dispersion relation is set so that the CRLH transmission line may operate as a left-handed medium. Since the CRLH transmission line operates as a left-handed medium, it is possible to shorten the wavelength of electromagnetic waves as the frequency becomes lower, and so it is possible to achieve a substantial reduction in size of the antenna.

The equivalent circuit of the unit structure of the antenna of the ninth exemplary embodiment is the same as the equivalent circuit in the EBG structure of the first exemplary embodiment shown in FIG. 3. By applying the periodic boundary condition to the equivalent circuit of the unit structure of FIG. 3, it is possible to find the dispersion relation of the CRLH transmission line in the antenna of the ninth exemplary embodiment. Next, an example of the characteristics of the antenna according to the exemplary embodiment of the present invention shall be described.

Figure 23:
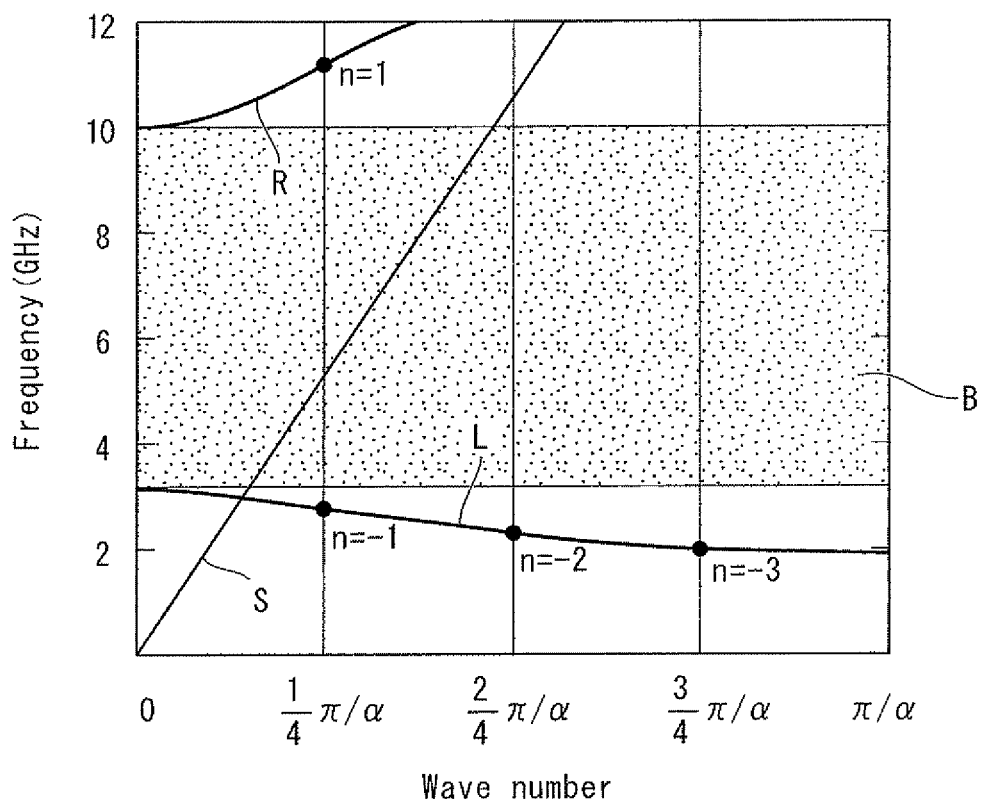
FIG. 23 is a graph that shows an example of the dispersion relation in the antenna of the ninth exemplary embodiment.

FIG. 23 is a graph that shows an example of the dispersion relation in the antenna of the ninth exemplary embodiment. As for the data that are used for the graph of FIG. 23, the parameters shown in FIG. 21 and FIG. 22 are as follows: s=10 mm, a=3.5 mm, g=50 μm, t=800 μm, h=100 μm, w=300 μm, and b=250 μm. Also, the transmission line length d=4 mm, the relative permittivity ∈ of the first dielectric layer 102 and the second dielectric layer 103=4.188 and the relative permeability thereof μ=1. In the graph of FIG. 23, the horizontal axis expresses the wave number, and the vertical axis expresses the frequency.

As shown in FIG. 23, the dispersion relation of the CRLH transmission line in the ninth exemplary embodiment is the downward curving line L in the frequency band from 1.9 GHz to 3.1 GHz. Accordingly, the CRLH transmission line operates as a left-handed medium in this frequency band. Moreover, the dispersion relation is the upward curving line R in the frequency band of 10 GHz or more. Therefore, a CRLH transmission line operates as a right-handed medium in this frequency band. As shown in FIG. 23, there is a band gap B between the right-hand band and left-hand band, that is, in the frequency band from 3.1 GHz to 10 GHz. Generally, a condition for resonance of ½ wavelength occurring in a resonator of wavelength L is n being an integer, and is given by the following Equation (10).

[Equation (10)]

$$k = \frac{n\pi}{L} \quad (10)$$

When the number of unit structures that constitute the CRLH transmission line is assumed to be N, the line length L of the whole CRLH transmission line is given by L=N×a. By substituting the line length L into Equation (10), the following Equation (11) is obtained as the resonance condition in a CRLH transmission line.

[Equation (11)]

$$k = \frac{n}{N}\frac{\pi}{a}, n = -(N-1), \ldots -1, 0, 1 \ldots , (N-1) \quad (11)$$

The vertical line in the graph of FIG. 23 expresses the wave number that satisfies the resonance condition shown in Equation (11) in the case of N=4 and a=3.5 mm in correspondence to the antenna structure of FIG. 19. Accordingly, the intersection of the vertical lines and the dispersion relation in the graph of FIG. 23 gives the ½ wavelength resonance frequency. In the frequency band shown in FIG. 23, resonance points exist corresponding to n=0, 1, 2, 3 in the right-hand band, and resonance points exist corresponding to n=0, −1, −2, −3 in the left-hand band.

In the graph of FIG. 23, the straight line S that passes through the origin is the dispersion relation of the dielectric substrate that consists of the first dielectric layer 102 and the second dielectric layer 103. The dispersion relation of this dielectric substrate is obtained by substituting the relative permittivity ∈=4.188 and the relative permeability μ=1 of the first dielectric layer 102 and the second dielectric layer 103. In the frequency band lower than the dispersion relation of the dielectric substrate, the wavelength of the electromagnetic wave that propagates through the CRLH transmission line is made shorter than in the dielectric substrate. Accordingly, in the CRLH transmission line of the present exemplary embodiment, by utilizing the resonant points corresponding to N=0, −1, −2, −3 of the left-hand band, it is possible to achieve a smaller antenna than an ordinary batch antenna that uses a dielectric substrate.

At the resonant points that are included in the higher frequency band than the dispersion relation of the dielectric substrate, the wavelength of the electromagnetic wave that propagates through the CRLH transmission line is made longer than in the dielectric substrate. Accordingly, it is possible to make the radiation efficiency higher by for example enlarging the antenna.

In a CRLH transmission line, it operates as a left-handed medium in the frequency region in which both Im (Z) and Im (Y) are negative. The admittance Y of the CRLH transmission line in the antenna according to the exemplary embodiment of the present invention can be found by Equation (2) and Equation (3). Accordingly, by suitably designing the parameters included in Equation (2) and Equation (3), a left-hand band can be designed at a desired frequency band.

As described in the first exemplary embodiment, in the structure of the exemplary embodiments of the present invention, it is possible to accurately and readily design the dispersion relation, and moreover since there is a high degree of freedom in the design of the transmission line length d of the stub, it is possible to accurately and readily control the operation band of the antenna according to the exemplary embodiment of the present invention, and the antenna can be made thinner.

In the ninth exemplary embodiment, there was shown as an example a constitution in which the short-circuit via 108 does not pass through the first dielectric layer 102. However, only if the short-circuit via 108 is provided so that the transmission line 106 and the conductor patch 104 may be connected electrically, a suitable modification to the aspect of the short-circuit via 108 is possible. For example, a constitution may be adopted in which the short-circuit via 108 passes through the first dielectric layer 102, and even in this kind of constitution, it is possible to obtain the effect of the exemplary embodiment of the present invention. In the case of the short-circuit via 108 being a through via that passes through the first dielectric layer 102, the short-circuit via 108 and the conductor plane 101 are insulated electrically. For example, an opening with a larger diameter than the short-circuit via 108 may be formed around the short-circuit via 108 in the conductor plane 101, so that the conductor plane 101 does not make contact with the short-circuit via 108. By adopting a through via, after lamination of various elements is completed, it is possible to process the laminated body by drill or the like in one step to thereby fabricate the short-circuit via 108 and, therefore, it is possible to increase the structure efficiency and lower the manufacturing cost.

Figure 24:
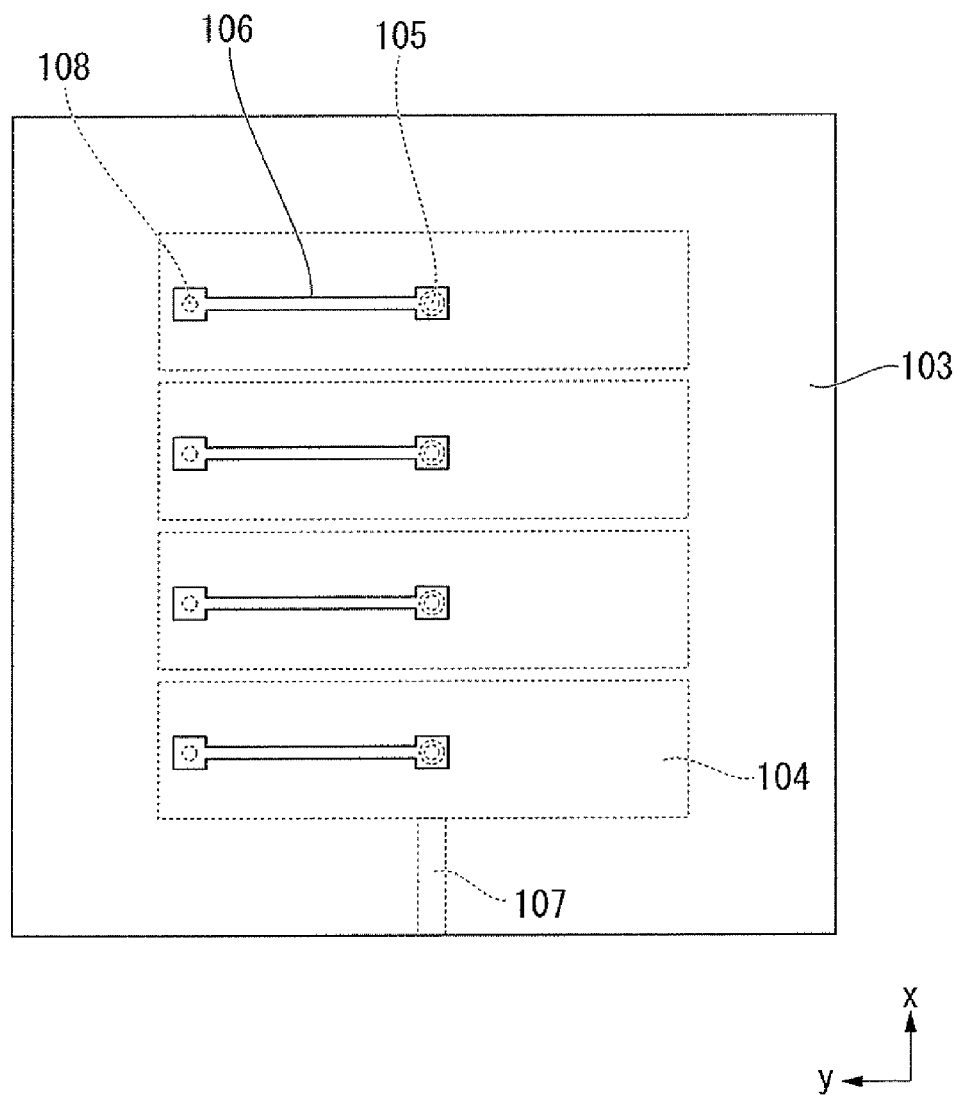
FIG. 24 is a plan view of a modification of the antenna of the ninth exemplary embodiment of the present invention.

In the ninth exemplary embodiment, there was shown as an example a constitution in which the shape of the transmission line was made a spiral shape, but the shape of the transmission line may also be a linear shape as shown for example in FIG. 24. One end portion of the transmission line 106 shown in FIG. 24 overlaps in a planar manner with the center portion of the conductor patch 104, and the other end portion overlaps in a planar manner with one of the end portions in the long side direction of the conductor patch 104. The one end portion of the transmission line 106 is electrically connected with the conductor via 105, and the other end portion is electrically connected with the short-circuit via 108. The shape of the transmission line 106 may be a spiral shape, linear shape or a meander shape. Also, the arrangement and shape of the transmission line 106 may differ for a plurality of unit structures. For example, a configuration is possible that mixes a unit structure in which a spiral-shaped transmission line is arranged and a unit structure in which a linear-shaped transmission line is arranged.

Figure 25:
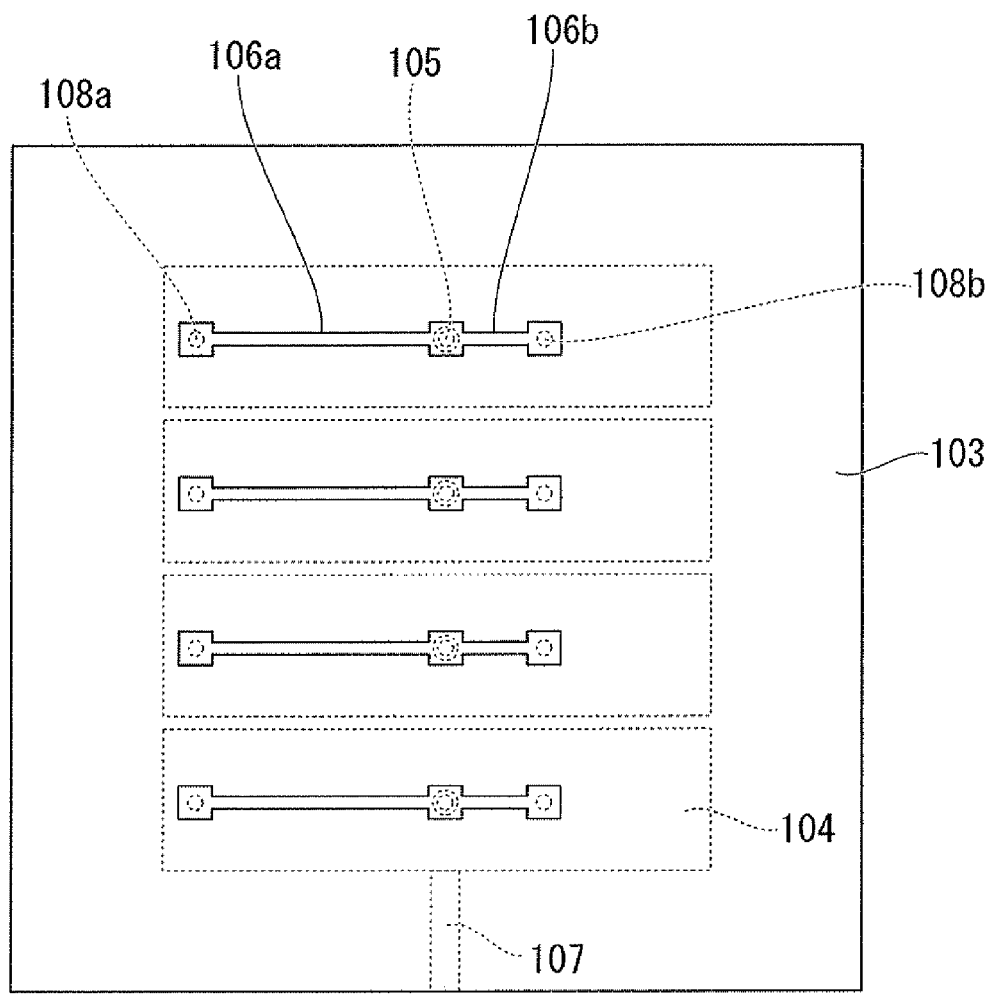
FIG. 25 is a plan view of a modification of the antenna of the ninth exemplary embodiment of the present invention.

In the ninth exemplary embodiment, there was shown as an example a constitution in which the end portions of the transmission line 106 are connected to the conductor via 105 and the short-circuit via 108, respectively. However, the portions of the transmission line 106 that are connected with the conductor via 105 and the short-circuit via 108 may be other than the end portions. For example, it may have a constitution in which the transmission line as shown in FIG. 25 includes branch lines 106*a*, 106*b* that mutually branch from a branching portion, with the connection portion with the conductor via 105 being the branching portion. Both of the branch lines 106*a*, 106*b* are continuous with the connection portion, and the lengths thereof mutually differ. Here, with the connection portion with the conductor via 105 serving as the start point, the short-circuit vias 108*a*, 108*b* are electrically connected to the end points of the branch lines 106*a*, 106*b*, respectively.

In the transmission line of this kind of constitution, the branch lines 106*a*, 106*b* can be regarded as branch lines that are branched with the connection portion serving as a start point. Also, it is possible to regard an electrical connection as being achieved at the connection portion between the start point and end point in the transmission lines that consist of the branch lines 106*a*, 106*b*. With this kind of antenna, since the impedance conversion cycles of the branch lines 106*a*, 106*b* differ, the design freedom of the dispersion relation becomes markedly higher. Also, a branch line may further be provided that has a portion of the branch lines 106*a*, 106*b* serve as a start point, and the branch lines 106*a*, 106*b* may have a linear shape, a polygonal shape, a curvilinear shape, or a shape that is a combination of these.

In the ninth exemplary embodiment, there was shown as an example a constitution in which the conductor patch 104 is rectangular, but provided there is capacitive coupling between adjacent conductor patches 104, it is possible to obtain the effect of the exemplary embodiment of the present invention even if the conductor patch 104 is a shape such as a square.

Figure 26:
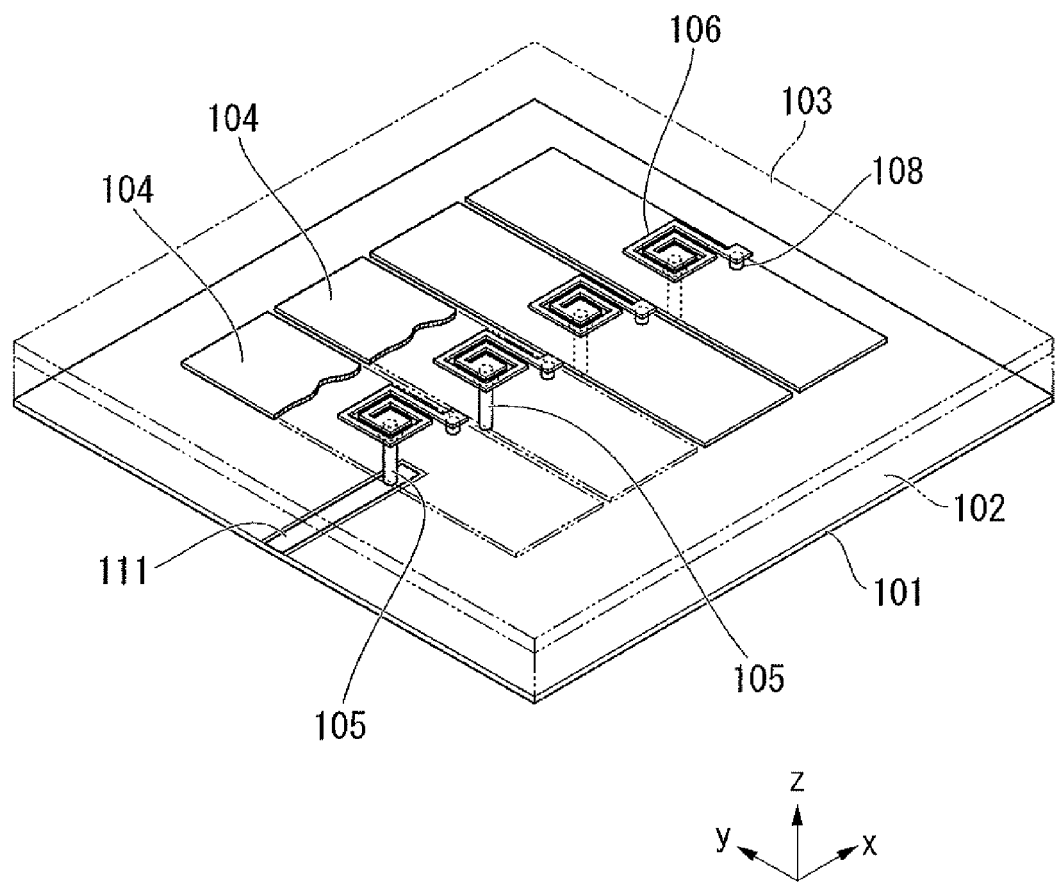
FIG. 26 is a perspective view of a modification of the antenna of the ninth exemplary embodiment of the present invention.

In the ninth exemplary embodiment, the case was shown of using the microstrip line 107 as a feed portion, but it is possible to use a feed portion other than the microstrip line 107. For example, as shown in FIG. 26, a constitution may be adopted that forms a coplanar line 111 by providing a slit in the conductor plane 101, and supplies power to the CRLH transmission line with the coplanar line 111 serving as the feed portion.

The coplanar line 111 is connected to the conductor via 105 of the unit structure that is positioned at the end of the CRLH transmission line. An electrical signal from a wireless circuit not illustrated is supplied to the CRLH transmission line via the coplanar line 111. With an antenna having this kind of constitution, since it is necessary to provide a slit in the conductor plane 101, electromagnetic waves end up leaking out from the rear surface at which the coplanar line 111 is provided in the antenna to the outer side. However, a coplanar line 111 may be provided for at least one unit structure, and since it is possible to reduce the number of coplanar lines 111, it is possible to minimize the radiation of electromagnetic waves to the rear surface side. FIG. 26 shows a constitution that supplies power to the end portion of the CRLH transmission line, however in order to perform impedance matching between the antenna and the feed portion, a constitution is also possible that supplies power to a unit structure at other than the end portion of the CRLH transmission line.

The antenna of the exemplary embodiment of the present invention can be readily manufactured according to a general process used for manufacturing printed circuit boards or device package substrates. Also, it is possible to provide the antenna of the present invention in a semiconductor device including silicon, using a fine wiring process that is used in semiconductor technology.

Next, an antenna according to the tenth exemplary embodiment of the present invention shall be described.

Figure 27:
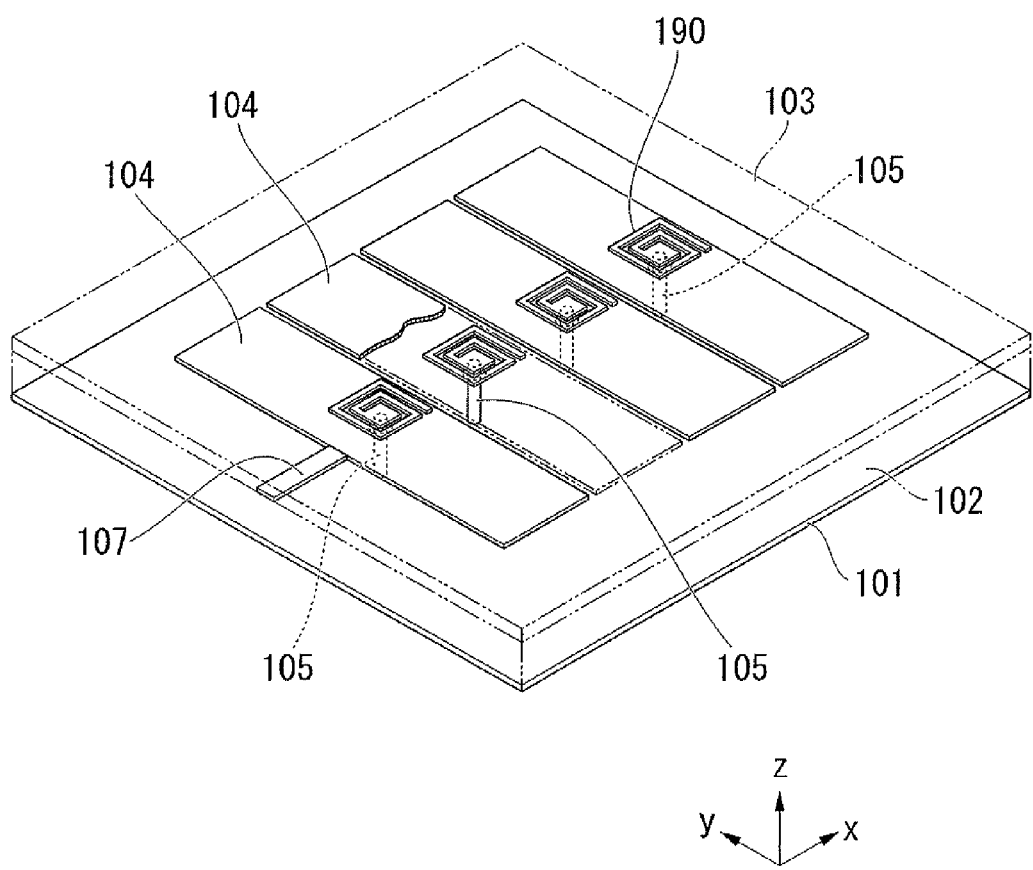
FIG. 27 is a perspective view of an antenna of a tenth exemplary embodiment of the present invention.
Figure 28:
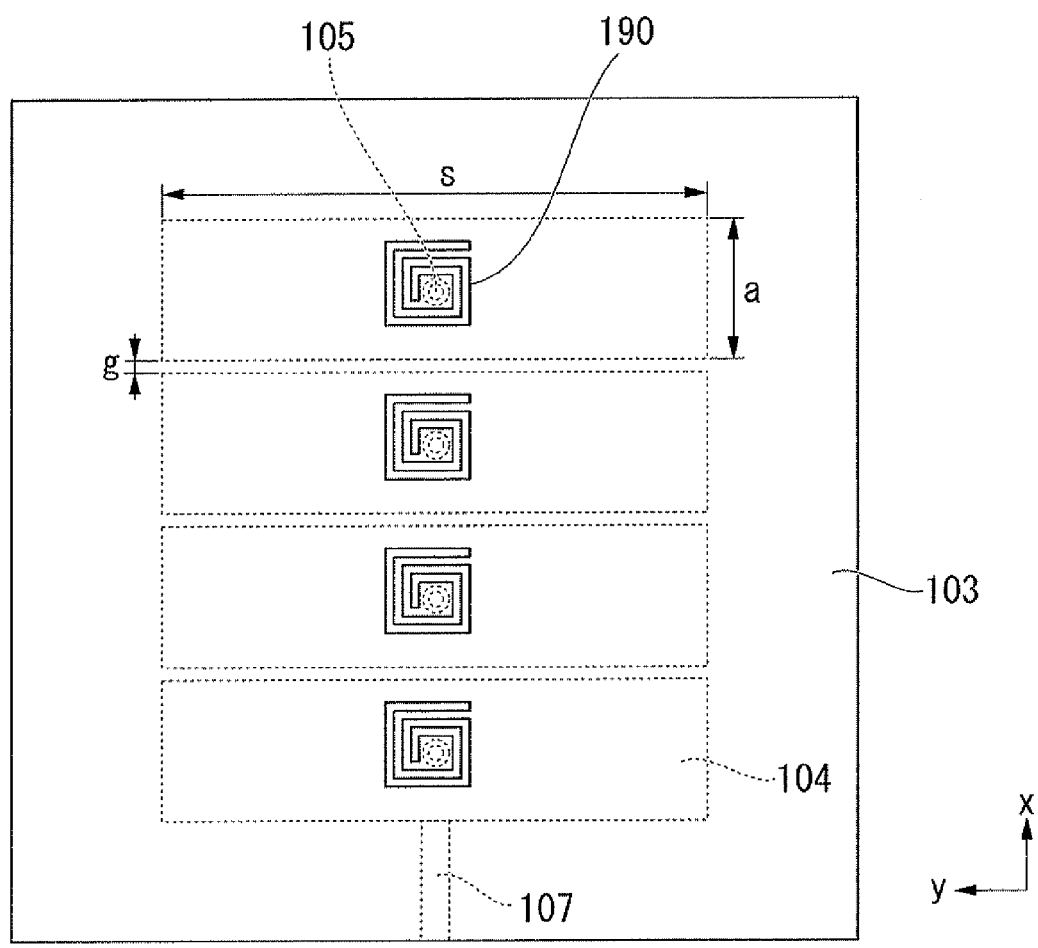
FIG. 28 is a plan view of the antenna of the tenth exemplary embodiment of the present invention viewed from a z-axis positive direction.
Figure 29:
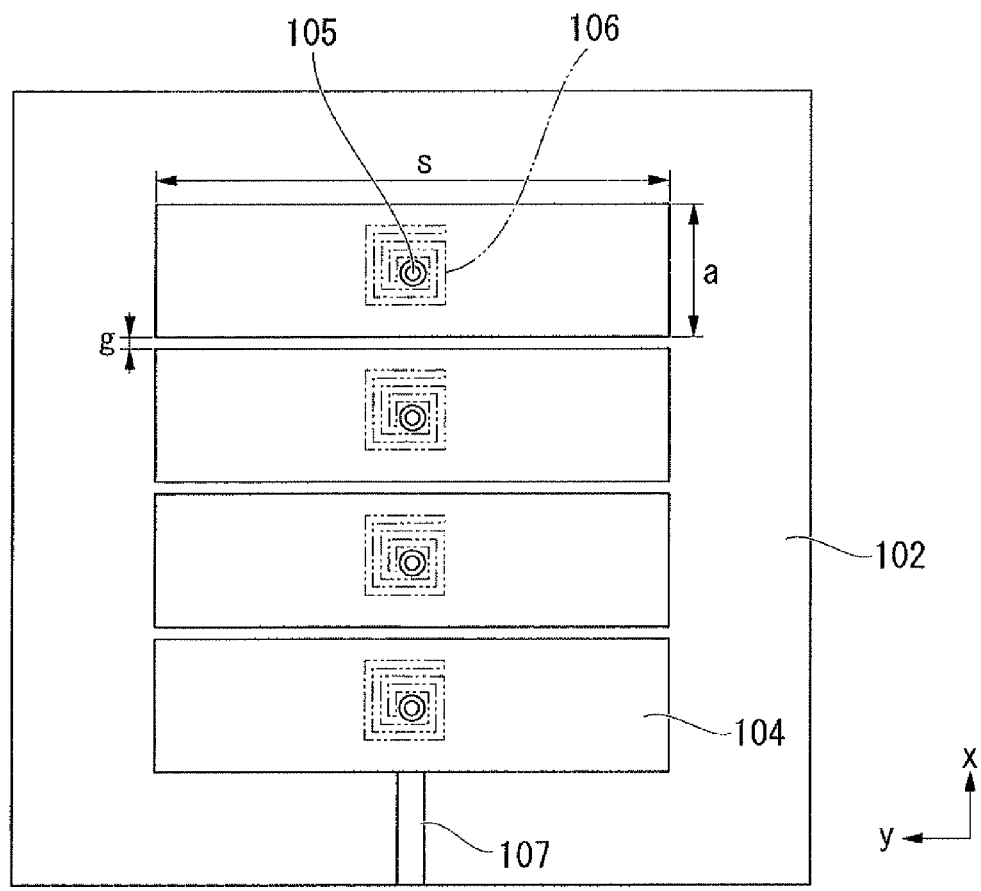
FIG. 29 is a plan view with the open end transmission in FIG. 28 made visible.

FIG. 27 is a perspective view that shows the constitution of the antenna of the tenth exemplary embodiment. For convenience of description, FIG. 27 shows the internal structure of the antenna with the second dielectric layer 103 made transparent. FIG. 28 is a plan view that shows the antenna of the tenth exemplary embodiment viewed from the z-axis positive direction. FIG. 29 is a plan view that shows the antenna viewed from the z-axis positive direction with the open end transmission line 190 made visible.

The antenna of the tenth exemplary embodiment adopts an open stub in place of the short stub in the antenna of the ninth exemplary embodiment. The open end transmission line 190 is provided in the antenna of the tenth exemplary embodiment in place of the transmission line 106 in the antenna of the ninth exemplary embodiment, and the short-circuit via 108 is not provided.

The open end transmission line 190 conducts electricity by the center portion of the spiral shape being in contact with the conductor via 105, and is connected with the conductor plane 101 via the conductor via 105. The end portion on the outer periphery of the spiral shape in the open end transmission line 190 is an open end. The open end transmission line 190 is constituted so as to function as an open stub that makes the conductor patch 104 serve as a return path. The EBG structure of the tenth exemplary embodiment is the same as the EBG structure of the ninth exemplary embodiment, except for the point of changing the short stub to the open stub.

The equivalent circuit of the unit structure of the antenna of the tenth exemplary embodiment is the same as the equivalent circuit diagram in the EBG structure of the second exemplary embodiment shown in FIG. 10. Also, the operation principle as an antenna is the same as the ninth exemplary embodiment. Even in the antenna of the tenth exemplary embodiment, it is possible to accurately and readily control the operation band, and also the antenna can be made thinner.

Next, an antenna according to the eleventh exemplary embodiment of the present invention shall be described.

Figure 30:
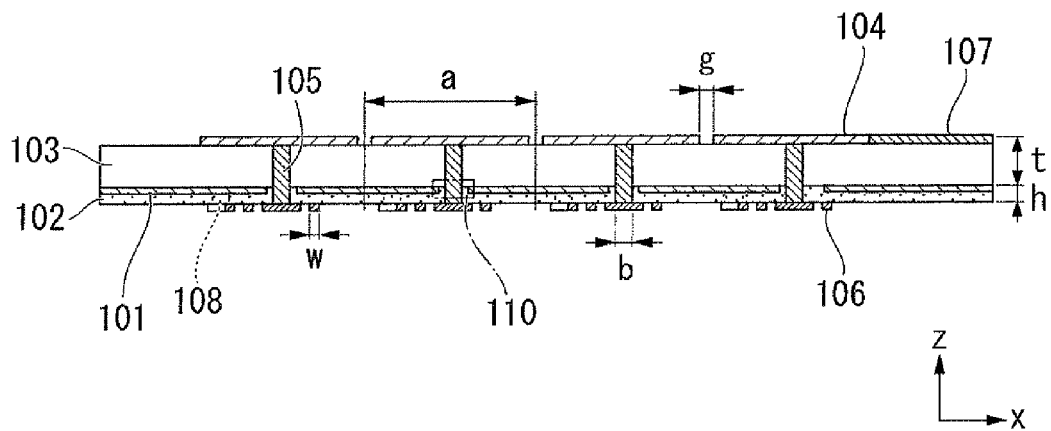
FIG. 30 is a cross-sectional view of an antenna of an eleventh exemplary embodiment of the present invention.

FIG. 30 is a cross-sectional view that shows the constitution of the antenna of the eleventh exemplary embodiment. Although the short-circuit via 108 is not precisely included in the cross-section shown in FIG. 30, for convenience of description, the short-circuit via 108 is indicated by a dotted line.

The antenna of the eleventh exemplary embodiment differs from the tenth exemplary embodiment on the point of one conductor plane of the first conductor plane (conductor plane 101) and the second conductor plane (conductor patch 104) in the structure body being the conductor plane 101, and the other conductor plane being the conductor patch 104. That is, the transmission line 106 is disposed on the opposite side of the other conductor plane (conductor patch 104) with respect to the one conductor plane (conductor plane 101).

The antenna of the eleventh exemplary embodiment as shown in FIG. 30 includes the first dielectric layer 102 and the second dielectric layer 103 that is arranged on one surface of the first dielectric layer 102. The conductor plane 101 is arranged on a layer that is sandwiched by the first dielectric layer 102 and the second dielectric layer 103. A plurality of the conductor patches 104 are arranged abutting the surface of the second dielectric layer 103 that is opposite the surface that abuts the conductor plane 101. The transmission line 106 is disposed abutting the surface of the first dielectric layer 102 that is opposite the surface that abuts the conductor plane 101.

The conductor via 105 is provided in a manner passing through the first dielectric layer 102, the conductor plane 101, and the second dielectric layer 103. At the portion of the conductor plane 101 that intersects with the conductor via 105, an opening is provided of a larger diameter than the outer diameter of the conductor via 105, and a clearance 110 is constituted. The conductor via 105 is arranged in this opening, so as not to make contact with the conductor plane 101. The transmission line 106 is electrically connected to the conductor patch 104 via the conductor via 105.

The short-circuit via 108 is provided in a manner passing through the first dielectric layer 102. The transmission line 106 is electrically connected with the conductor patch 104 via the short-circuit via 108. The transmission line 106 is constituted so as to function as a short stub which uses conductor plane 101 as a return path. The microstrip line 107 that constitutes the feed portion is arranged on the same layer as the conductor patch 104.

The antenna of the eleventh exemplary embodiment includes a periodic structure in which a unit structure that corresponds to the scope indicated by the symbol "a" in FIG. 30 is periodically disposed. The unit structure includes the conductor patch 104, the conductor via 105, the short-circuit via 108, and the transmission line 106. In the periodic structure, the conductor patch 104 is disposed with a gap "g" so as to possess electrical capacitance with an adjacent conductor patch 104.

The antenna of the eleventh exemplary embodiment operates in the same manner as that of the ninth exemplary embodiment. Even in the antenna of the tenth exemplary embodiment, it is possible to accurately and readily control the operation band, and the antenna can be made thinner.

Next, an antenna according to the twelfth exemplary embodiment of the present invention shall be described.

Figure 31:
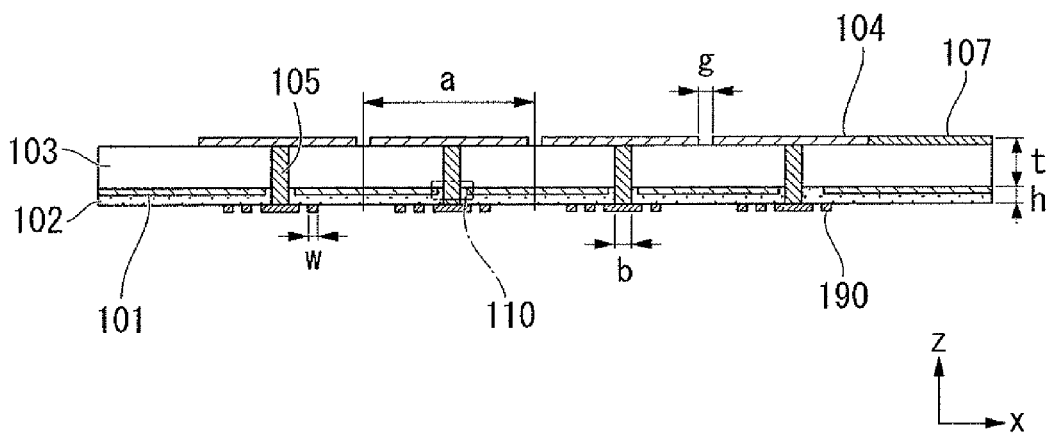
FIG. 31 is a cross-sectional view of an antenna of a twelfth exemplary embodiment of the present invention.

FIG. 31 is a cross-sectional view that shows the constitution of the antenna of the twelfth exemplary embodiment. The antenna of the twelfth exemplary embodiment adopts an open stub in place of the short stub in the antenna of the eleventh exemplary embodiment. The open end transmission line 190 is provided in the antenna of the twelfth exemplary embodiment in place of the transmission line 106 in the antenna of the eleventh exemplary embodiment, and the short-circuit via 108 is not provided.

The open end transmission line 190 conducts electricity by the center portion of the spiral shape being in contact with the conductor via 105, and is connected with the conductor plane 101 via the conductor via 105. The end portion on the outer periphery of the spiral shape in the open end transmission line 190 is an open end. The open end transmission line 190 is constituted so as to function as an open stub that makes the conductor patch 104 serve as a return path. The EBG structure of the twelfth exemplary embodiment is the same as the EBG structure of the first exemplary embodiment, except for the point of changing the short stub to the open stub.

The equivalent circuit of the unit structure of the antenna of the twelfth exemplary embodiment is the same as the equivalent circuit in the EBG structure of the second exemplary embodiment shown in FIG. 10. Also, the operation principle as an antenna is the same as the ninth exemplary embodiment. Even in the antenna of the twelfth exemplary embodiment, it is possible to accurately and readily control the operation band, and also the antenna can be made thinner.

Next, an antenna according to the thirteenth exemplary embodiment of the present invention shall be described.

As shown in FIG. 23, the dispersion relation of the CRLH transmission line in the ninth exemplary embodiment has a band gap B between the right-hand band and the left-hand band, that is, in the frequency band from 3.1 GHz to 10 GHz. This is because there is a gap between the resonance frequency of the serial impedance Z that specifies the lower frequency limit of a right-hand band and the resonance frequency of the admittance Y which specifies the upper frequency limit of the left-hand band.

In the case of a band gap existing in the dispersion relation of the CRLH transmission line, the Bloch impedance of the CRLH transmission line is known to have a steep frequency dependency. For that reason, in the case of having a band gap, wideband impedance matching with the power supply line is difficult. For such a reason, it is preferable to design a CRLH transmission line that is operated as a portion of the antenna so as to satisfy a condition (called a balance condition) that eliminates the band gap by making the resonance frequency of the admittance Y and the serial impedance Z match.

Figure 32:
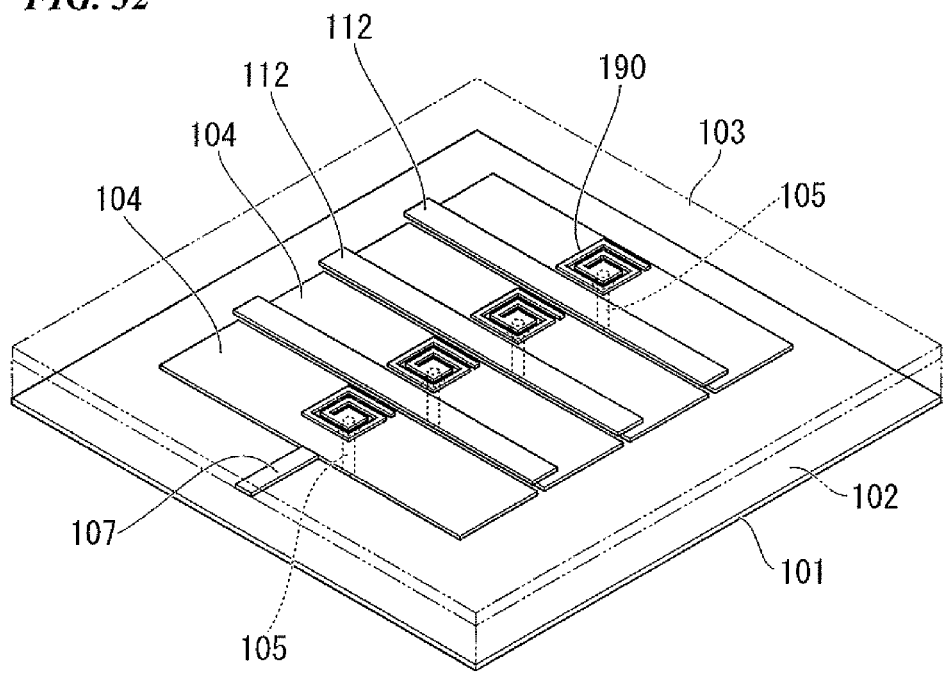
FIG. 32 is a perspective view of an antenna of a thirteenth exemplary embodiment of the present invention.
Figure 33:
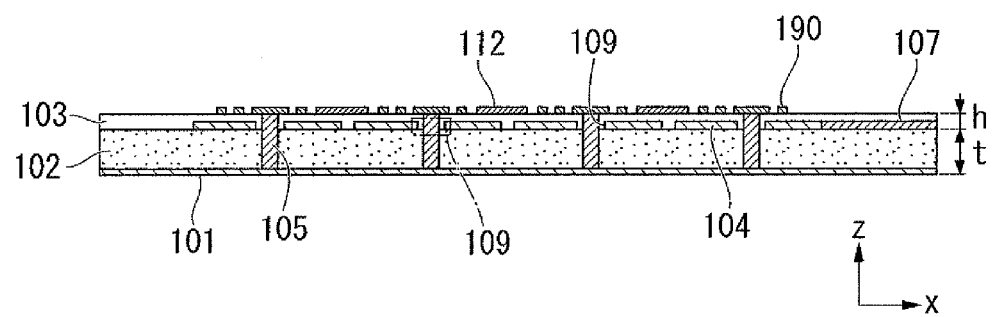
FIG. 33 is a cross-sectional view of the antenna of the thirteenth exemplary embodiment of the present invention.

FIG. 32 is a perspective view that shows the antenna of the thirteenth exemplary embodiment. FIG. 33 is a cross-sectional view in the xy plane that includes the conductor via 105 of the antenna of FIG. 32.

The antenna of the thirteenth exemplary embodiment adds an auxiliary conductor patch 112 as an auxiliary conductor plane to the antenna of the tenth exemplary embodiment. The structure in the thirteenth exemplary embodiment has a constitution in which one conductor plane of the first conductor plane (conductor plane 101) and the second conductor plane (conductor patch 104) is the conductor patch 104, and the other conductor plane is the conductor plane 101. That is, the open end transmission line 190 is arranged on the opposite side of the other conductor plane (conductor plane 101) with respect to the one conductor plane (conductor patch 104).

The auxiliary conductor patch 112 is provided on the same layer as the open end transmission line 190. The auxiliary conductor patch 112 is disposed so as to overlap in the z-axis direction with both of the two adjacent conductor patches 104. The planar shape of the auxiliary conductor patch 112 is rectangular, and the long side direction matches the long side direction of the conductor patches 104.

With the antenna of the thirteenth exemplary embodiment, capacitive coupling via the auxiliary conductor patch 112 is connected in parallel to the direct capacitive coupling between the two conductor patches 104 that are adjacent. Accordingly, it is possible to readily increase $C_L$ that is the capacitance between two conductor patches 104, and it is possible to readily design the CRLH transmission line that satisfies the balance condition.

In the thirteenth exemplary embodiment, it is possible to adopt a short stub in place of an open stub.

The thirteenth exemplary embodiment showed the case of the shape of the auxiliary conductor patch 112 being rectangular, but provided it constitutes electrical capacitance by overlapping with both of the two conductor patches 104 that are adjacent, the shape of the auxiliary conductor patch 112 may be suitably changed.

The thirteenth exemplary embodiment showed the case of the auxiliary conductor patch 112 being provided on the same layer as the open end transmission line 190. However, provided the auxiliary conductor patch 112 constitutes electrical capacitance by overlapping with both of the two conductor patches 104 that are adjacent, a constitution is also possible in which the auxiliary conductor patch 112 is provided on a different layer from the open end transmission line 190. Also, it is possible to make the structure bodies according to the first to fifth exemplary embodiments into constitutions provided with the auxiliary conductor patch 112.

Next, an antenna according to the fourteenth exemplary embodiment of the present invention shall be described.

Figure 34:
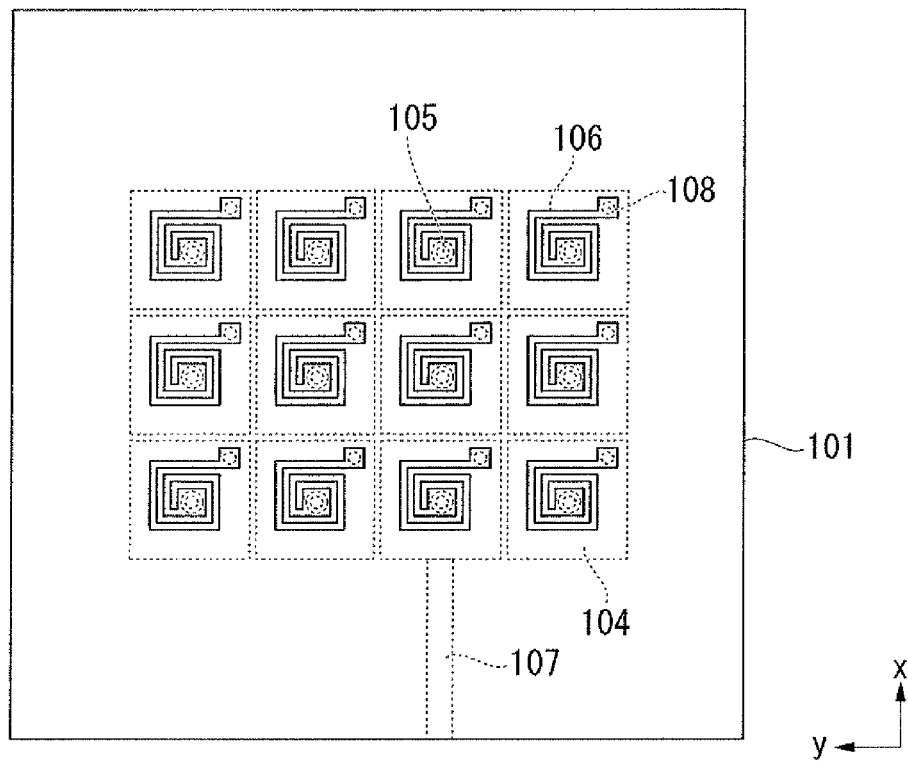
FIG. 34 is a plan view of an antenna of a fourteenth exemplary embodiment of the present invention viewed from a z-axis positive direction.
Figure 35:
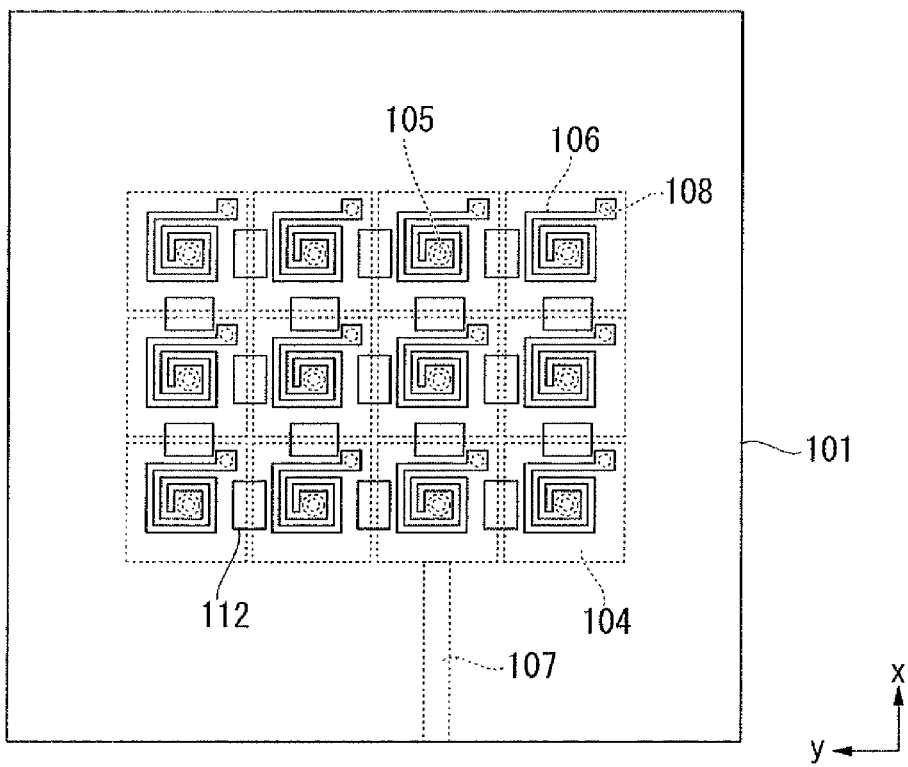
FIG. 35 is a plan view of an antenna of a modification of the fourteenth exemplary embodiment of the present invention.
Figure 36:
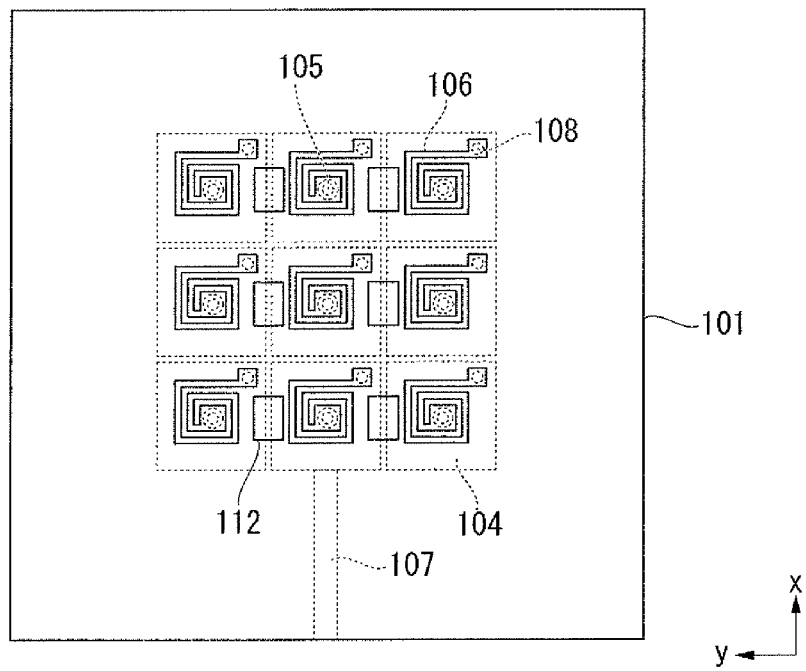
FIG. 36 is a plan view of an antenna of a modification of the fourteenth exemplary embodiment of the present invention.

FIG. 34 is a plan view of the antenna according to the fourteenth exemplary embodiment viewed from the z-axis positive direction. FIGS. 35 and 36 are plan views of the antenna according to a modification of the fourteenth exemplary embodiment, viewed from the z-axis direction.

The antenna of the fourteenth exemplary embodiment differs from the antennas of the ninth to thirteenth exemplary embodiments on the point of the unit structure being two-dimensionally arrayed. Here, the shape of the conductor patch 104 is square, and three of the unit structures are arrayed in the x-axis direction and four in the y-axis direction. Since a CRLH transmission line having different line lengths L in the x-axis direction and y-axis direction is formed in the antenna of the fourteenth exemplary embodiment, the frequency at which the ½-wavelength resonance occurs differs in the x-axis direction and y-axis direction. Thereby, the antenna of the fourteenth exemplary embodiment is designed to function as a dual-band antenna or a multi-band antenna.

As shown in FIG. 35, the antenna of the fourteenth exemplary embodiment may have a constitution that is provided with the auxiliary conductor patch 112 that was described in the thirteenth exemplary embodiment. In the antenna shown in FIG. 35, the auxiliary conductor patch 112 is provided between two conductor patches 104 that are adjacent in the x-axis direction, and between two conductor patches 104 that are adjacent in the y-axis direction. With an antenna having such a constitution, it is possible to readily increase the capacitance between adjacent conductor patches 104, and it is possible to readily achieve a dual-band antenna or multi-band antenna that satisfies the balance condition of the CRLH transmission line.

A constitution is also possible in which the auxiliary conductor patch 112 is provided between two conductor patches 104 that are adjacent in the x-axis direction or between two conductor patches 104 that are adjacent in the y-axis direction. In the antenna shown in FIG. 36, three unit structures are arrayed in the x-axis direction and three in the y-axis direction. The auxiliary conductor patch 112 is provided between two conductor patches 104 that are adjacent in the y-axis direction. With an antenna having such a constitution, since the auxiliary conductor patch 112 is provided in the y-axis direction only, the dispersion relation of the CRLH transmission line shows anisotropy in the x-axis direction and y-axis direction. That is, the unit structure is symmetrically arrayed in the x-axis direction and y-axis direction, but the frequency at which the ½-wavelength resonance occurs differs in the x-axis direction and y-axis direction. Thereby, it is possible to use the antenna shown in FIG. 36 as a dual-band antenna or a multi-band antenna.

FIG. 36 shows an example of a constitution in which the auxiliary conductor patch 112 is provided in the y-axis direction only, but of course a constitution is also possible in which the auxiliary conductor patch 112 is provided in the x-axis direction only. Also, a constitution is possible that makes the size of the auxiliary conductor patch 112 different in the x-axis direction and y-axis direction so that the dispersion relation has anisotropy in the x-axis direction and y-axis direction. The fourteenth exemplary embodiment showed the case of using the microstrip line 107 as the feed portion, but it is also possible to use the coplanar line 111 shown in FIG. 25 or another feed portion.

Next, an array antenna according to the fifteenth exemplary embodiment of the present invention shall be described.

Figure 37:
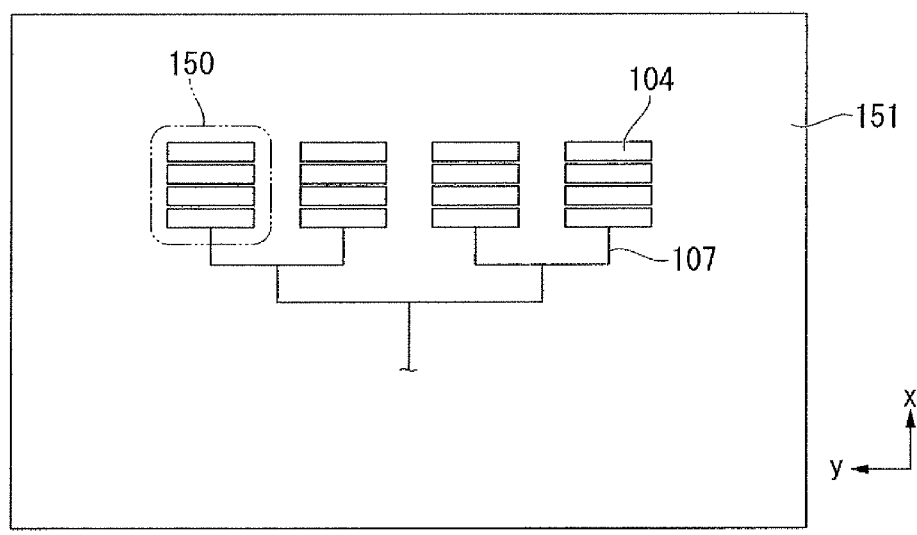
FIG. 37 is a plan schematic view of an array antenna of a fifteenth exemplary embodiment of the present invention.

FIG. 37 is a planar view that schematically shows the constitution of the array antenna of the fifteenth exemplary embodiment. As shown in FIG. 37, with an antenna according to an exemplary embodiment of the present invention serving as an array element 150, the array antenna of the fifteenth exemplary embodiment has a constitution in which a plurality of the array elements 150 are arrayed on a printed circuit board 51. Here, the antenna described in the ninth exemplary embodiment is adopted as the array element 150, and four array elements 150 are arrayed one-dimensionally. The array elements 150 are connected in parallel by the microstrip line 107.

The directivity of the array antenna of the fifteenth exemplary embodiment is beam-shaped, and it is possible to increase the antenna gain in the beam direction. It is or course possible to use an antenna of another exemplary embodiment of the present invention as the array element 150. Also, by increasing the number of array elements 150, it is possible to make the beam sharper and increase the gain in the beam direction.

While the invention has been particularly shown and described with reference to exemplary embodiments thereof, the invention is not limited to these embodiments. It will be understood by those of ordinary skill in the art that various changes in form and details may be made therein without departing from the scope of the present invention.

This application is based upon and claims the benefit of priority from Japanese Patent Application No. 2008-199624, filed Aug. 1, 2008, and Japanese Patent Application No. 2009-111439, filed Apr. 30, 2009, the contents of which are incorporated herein in its entirety by reference.

INDUSTRIAL APPLICABILITY

The exemplary embodiment of the present invention can be applied to a structure, and a printed circuit board, an antenna, a transmission line to waveguide converter, an array antenna, and an electronic device that is provided with this structure. According to this structure and the printed circuit board, the antenna, the transmission line to waveguide converter, the array antenna, and the electronic device that is provided with this structure, it is possible to make the structure thinner, and a band gap frequency band can be readily designed.

REFERENCE SYMBOLS

1 Conductor plane (first conductor plane)
2 Conductor patch (second conductor plane)
3 Conductor via (first conductor connecting portion)
4 Transmission line
5 Clearance
6 Short-circuit via (second conductor connecting portion)
9 Unit structure
10, 102 First dielectric layer
11, 103 Second dielectric layer
40 Third dielectric layer
60 Patch antenna (antenna)
70 Reverse L-shaped antenna (antenna)
80 Transmission line to waveguide converter
112 Auxiliary conductor patch (auxiliary conductor patch)
190 Open end transmission line (transmission line)

The invention claimed is:
1. A structure comprising:
a first conductor plane;
a plurality of second conductor planes that are substantially parallel to the first conductor plane;
a transmission line that is substantially parallel to the first conductor plane; and
a first conductor connecting portion that is electrically connected to the transmission line, wherein:
one conductor plane of the first conductor plane and the plurality of second conductor planes does not contact the transmission line,
an other conductor plane of the first conductor plane and the plurality of second conductor planes is electrically connected to the transmission line,
the one conductor plane is disposed between the other conductor plane and the transmission line,
the one conductor plane is a single conductor plane with an opening that is not continuous with a periphery of the one conductor plane,
the transmission line overlaps the one conductor plane in a direction perpendicular to the first conductor plane, except in a portion of the transmission line that faces the opening of the one conductor plane,
the one conductor plane is a return path of the transmission line, and
a plurality of unit structures each including at least the second conductor plane, the transmission line, and the first conductor connecting portion are repeatedly disposed.

2. The structure according to claim 1, wherein the unit structures are periodically arrayed one-dimensionally or two-dimensionally.

3. The structure according to claim 1, wherein each of the plurality of unit structures that are repeatedly disposed shares the same first conductor plane.

4. The structure according to claim 1, wherein each of the unit structures has a band gap in a dispersion relation of frequency with respect to a wave number or a wavelength of an electromagnetic wave that is incident upon the unit structure, and an electromagnetic band gap structure is constituted by including each of the unit structures.

5. The structure according to claim 1, wherein a dielectric layer is provided between the first conductor plane and the second conductor plane, and the first conductor connecting portion is a conductor via that is provided passing through the dielectric layer.

6. The structure according to claim 5, wherein the conductor via intersects with the one conductor plane by passing through the opening, and makes no contact with the one conductor plane.

7. The structure according to claim 1, wherein a dimension of the one conductor plane in a surface direction of a surface that faces the second conductor plane differs from a dimension of the second conductor plane in a surface direction of a surface that faces the first conductor plane.

8. The structure according to claim 1, wherein a surface of the second conductor plane that faces the first conductor plane is parallel with a surface of the first conductor plane that faces the second conductor plane.

9. The structure according to claim 1, wherein the transmission line includes a plurality of end portions, and at least one of the plurality of end portions is electrically connected with the first conductor connecting portion.

10. The structure according to claim 1, wherein the transmission line includes a branching portion and branch lines that are mutually branched from the branching portion, and the line lengths of the branch lines mutually differ.

11. The structure according to claim 1, wherein the transmission line is planarly provided on a surface facing the one conductor plane, and the planar shape of the transmission line is a spiral shape.

12. The structure according to claim 1, wherein the transmission line is planarly provided on a surface facing the one conductor plane, and planar shape of the transmission line is a meander shape.

13. The structure according to claim 1, wherein the transmission line is covered by a dielectric portion.

14. The structure according to claim 1, further comprising:
a second conductor connecting portion that electrically connects the one conductor plane and the transmission line,
wherein a portion at which the transmission line is electrically connected to the second conductor connecting portion and a portion at which the transmission line is electrically connected to the first conductor connecting portion are arranged at different positions in an extending direction of the transmission line.

15. The structure according to claim 1, wherein the transmission line is electrically insulated with respect to the one conductor plane.

16. A printed circuit board comprising the structure according to claim 1.

17. The printed circuit board according to claim 16, wherein a reflecting plate is constituted by the structure.

18. An antenna comprising the structure according to claim 1.

19. The antenna according to claim 18, wherein a reflecting plate is constituted by the structure.

20. The structure according to claim 1, wherein the transmission line is a short stub.

21. The structure according to claim 1, wherein the transmission line is an open stub.

22. A structure comprising:
a first conductor plane;
a plurality of second conductor planes each having a rectangular shape, the plurality of second conductor planes being substantially parallel to the first conductor plane;
a transmission line having a spiral shape, the transmission line being substantially parallel to the first conductor plane; and
a first conductor connecting portion that is electrically connected to the transmission line,
wherein:
one conductor plane of the first conductor plane and the plurality of second conductor planes does not contact the transmission line,
an other conductor plane of the first conductor plane and the plurality of second conductor planes is electrically connected to the transmission line,
the one conductor plane is disposed between the other conductor plane and the transmission line,
the one conductor plane is a single conductor plane with an opening that is not continuous with a periphery of the one conductor plane,
the transmission overlaps the one conductor plane in a direction perpendicular to the first conductor plane, except in an area of the transmission line that faces the opening,
the one conductor plane is a return path of the transmission line, and
a plurality of unit structures each including at least the second conductor plane, the transmission line, and the first conductor connecting portion are repeatedly disposed.

23. The structure according to claim 22, wherein the transmission line is a short stub.

24. The structure according to claim 22, wherein the transmission line is an open stub.

25. The structure according to claim 22, wherein a dielectric layer is provided between the first conductor plane and the second conductor plane, and the first conductor connecting portion is a conductor via that is provided passing through the dielectric layer.

26. The structure according to claim 25, wherein the conductor via intersects with the one conductor plane by passing through the opening, and makes no contact with the one conductor plane.

* * * * *